(12) United States Patent
Maejima

(10) Patent No.: US 9,159,439 B2
(45) Date of Patent: Oct. 13, 2015

(54) SEMICONDUCTOR MEMORY DEVICE

(71) Applicant: KABUSHIKI KAISHA TOSHIBA, Tokyo (JP)

(72) Inventor: Hiroshi Maejima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 207 days.

(21) Appl. No.: 14/013,833

(22) Filed: Aug. 29, 2013

(65) Prior Publication Data

US 2014/0269093 A1 Sep. 18, 2014

(30) Foreign Application Priority Data

Mar. 14, 2013 (JP) ................................ 2013-052396

(51) Int. Cl.
*G11C 16/06* (2006.01)
*G11C 16/26* (2006.01)
*G11C 11/56* (2006.01)
*G11C 16/04* (2006.01)
*G11C 16/08* (2006.01)

(52) U.S. Cl.
CPC ............ *G11C 16/26* (2013.01); *G11C 11/5642* (2013.01); *G11C 16/0483* (2013.01); *G11C 16/06* (2013.01); *G11C 16/08* (2013.01)

(58) Field of Classification Search
CPC ................ G11C 16/26; G11C 11/5642; G11C 16/0483; G11C 7/12; G11C 11/4091; G11C 2207/065
USPC .................... 365/185.21, 185.18, 185.25, 205
See application file for complete search history.

(56) References Cited

U.S. PATENT DOCUMENTS

| 6,442,069 | B1 * | 8/2002 | Srinivasan et al. ....... 365/185.21 |
| 7,236,401 | B2 | 6/2007 | Kameda |
| 7,266,016 | B2 | 9/2007 | Kameda |
| 8,238,182 | B2 | 8/2012 | Yoshida et al. |
| 8,923,074 | B2 | 12/2014 | Yoshihara et al. |
| 2002/0093804 | A1 | 7/2002 | Schoenborn |
| 2003/0072175 | A1 | 4/2003 | Kawamura |
| 2006/0023555 | A1 | 2/2006 | Morishima |
| 2008/0031075 | A1 | 2/2008 | Hong et al. |

(Continued)

FOREIGN PATENT DOCUMENTS

| JP | S6139296 A | 2/1986 |
| JP | S6258489 A | 3/1987 |

(Continued)

OTHER PUBLICATIONS

U.S. Appl. No. 12/406,524, filed Mar. 18, 2009, 65 pages.

(Continued)

*Primary Examiner* — David Lam
(74) *Attorney, Agent, or Firm* — Patterson & Sheridan, LLP

(57) ABSTRACT

A semiconductor memory device includes a sense amplifier, and the sense amplifier includes a bus, first and second latch circuits, and a third transistor. The first latch circuit includes a first transistor connected to the bus, and the second latch circuit includes a second transistor connected to the bus. When data is transmitted from the first latch circuit to the second latch circuit, a third transistor is switched on to precharge the bus by applying a first voltage that is lower than a power source voltage of the first and second latch circuits to a gate of the third transistor. Thereafter, second and third voltages that are lower than the power source voltage are applied to gates of first and second transistors, respectively.

20 Claims, 29 Drawing Sheets

(56) References Cited

U.S. PATENT DOCUMENTS

| | | |
|---|---|---|
| 2010/0037007 A1 | 2/2010 | Futatsuyama et al. |
| 2011/0220987 A1 | 9/2011 | Tanaka et al. |
| 2011/0235416 A1 | 9/2011 | Otsuka et al. |
| 2015/0078102 A1 | 3/2015 | Yasufuku |

FOREIGN PATENT DOCUMENTS

| | | |
|---|---|---|
| JP | H11-288596 A | 10/1999 |
| JP | 2003-346491 A | 12/2003 |
| JP | 2010-040109 A | 2/2010 |
| JP | 2011065690 A | 3/2011 |
| JP | 2011-233180 A | 11/2011 |
| JP | 2012-216266 A | 11/2012 |
| JP | 2012216271 A | 11/2012 |
| JP | 2013009212 A | 1/2013 |
| JP | 2015056199 A | 3/2015 |

OTHER PUBLICATIONS

U.S. Appl. No. 12/679,991, filed Mar. 25, 2010, 111 pages.
U.S. Appl. No. 12/532,030, filed Sep. 18, 2009, 80 pages.
Japanese Office Action dated Jun. 23, 2015, filed in Japanese counterpart Application No. 2013-052396, 13 pages (with transiation).

* cited by examiner

SEMICONDUCTOR MEMORY DEVICE

CROSS-REFERENCE TO RELATED APPLICATION

This application is based upon and claims the benefit of priority from Japanese Patent Application No. 2013-052396, filed Mar. 14, 2013, the entire contents of which are incorporated herein by reference.

FIELD

Embodiments described herein relate to a semiconductor memory device.

BACKGROUND

A NAND flash memory in which memory cells are arranged in three dimensions is known in the related art.

DETAILED DESCRIPTION

Figure 1:
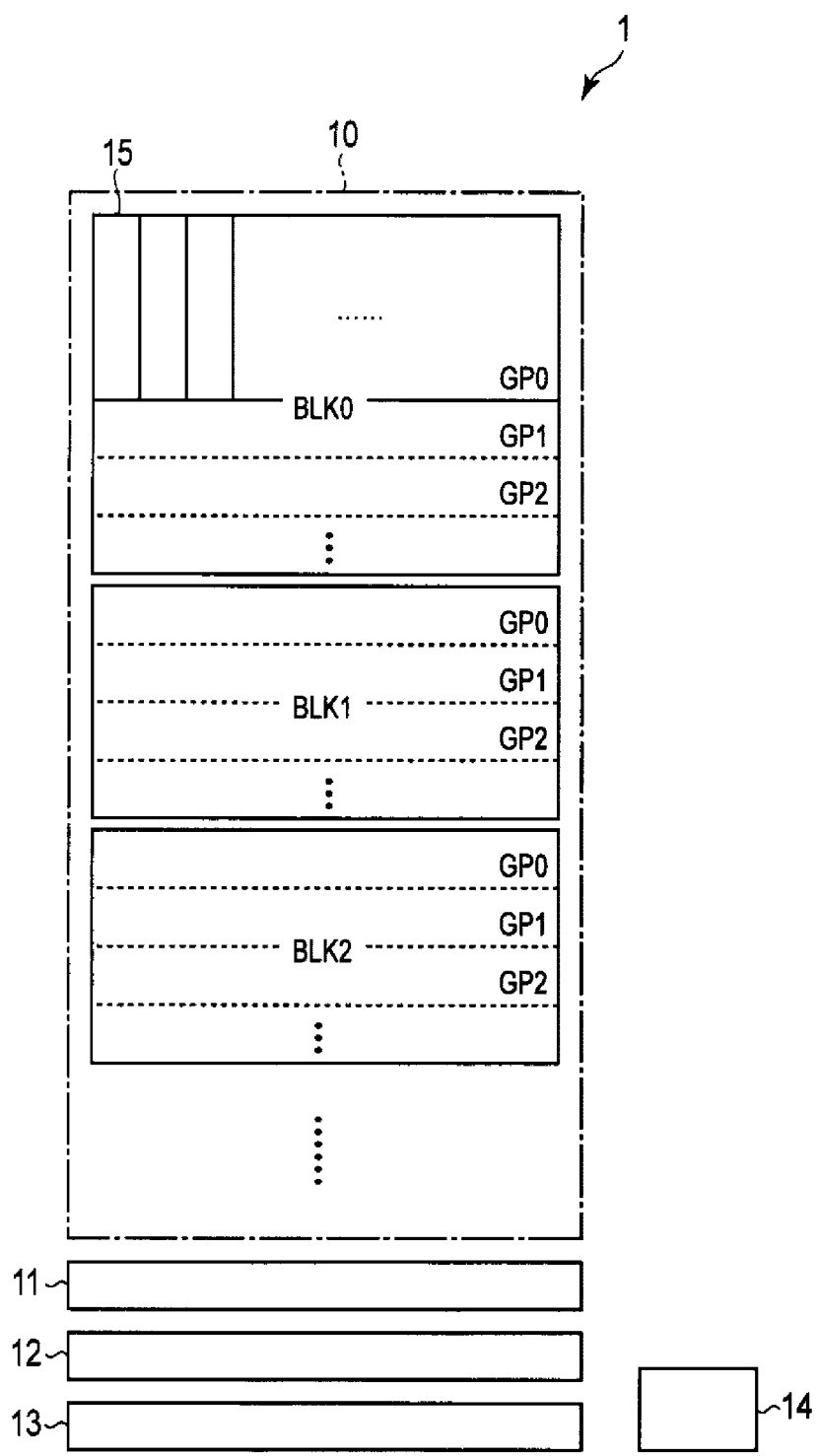
FIG. 1 is a block diagram of a semiconductor memory device according to a first embodiment.

A semiconductor memory device according to an embodiment includes a memory cell array having multiple memory cells that are stacked above a semiconductor substrate and a sense amplifier that can retain data read from or to be written to a memory cell. The sense amplifier includes a bus that can transmit the data, a first latch circuit, a second latch circuit, and a transistor that controls precharging of the bus. The first latch circuit includes a first data retention unit, and a first transistor that connects the first data retention unit and the bus. The second latch circuit includes a second data retention unit, and a second transistor that connects the second data retention unit and the bus. When the data is transmitted from the first latch circuit to the second latch circuit, the third transistor is switched on by applying a first voltage lower than a power source voltage of the first and second latch circuits to a gate of the third transistor to precharge the bus to an electric potential lower than the power supply voltage. Furthermore, after precharging the bus, second and third voltages that are lower than the power source voltage are applied to gates of the first and second transistors, respectively.

Embodiments are described below referring to the drawings. Like parts are given like reference numerals throughout the drawings and in the description.

1. First Embodiment

A semiconductor memory device according to a first embodiment is described. A three-dimensional stacked type NAND flash memory in which memory cells are stacked above a semiconductor substrate is described below as an example of a semiconductor memory device.

1.1 Configuration of Semiconductor Memory device

First, a configuration of the semiconductor memory device according to the present embodiment is described.

1.1.1 Entire Configuration of Semiconductor Memory Device

FIG. 1 is a block diagram of the semiconductor memory device according to the present embodiment. A NAND flash memory 1, as illustrated, includes a memory cell array 10, a sense amplifier module 11, a column selector 12, an input and output circuit 13 and a control circuit 14.

The memory cell array 10 includes multiple (for example, N units) blocks BLK (BLK0, BLK1, BLK2, . . . ), each of which is a set of nonvolatile memory cells. Data inside the same block BLK are removed in a lump. Each of the blocks BLK includes multiple (for example, M units) memory groups GP (GP0, GP1, GP2, . . . ), each of which is a set of NAND strings 15 in which the memory cells are connected in series. The number of blocks inside the memory cell array 10 and the number of memory groups inside the block are arbitrary.

The sense amplifier module 11 senses/amplifies data that is read from memory cell at the time of data reading. Furthermore, during writing of data, write data is transmitted to a memory cell. The sense amplifier module 11 has a set of multiple sense amplifier units, a latch circuit, a bus, and the like. These are described in detail below.

The column selector 12 selects a column direction (a bit line described below) of memory cell array 10.

The input and output circuit 13 governs transmitting and receiving of data between a NAND flash memory 1 and an outside controller or a host apparatus. Then, the input and output circuit 13 outputs the data, which are sensed/amplified with the sense amplifier module 11, to the outside at the time of data reading. Furthermore, the input and output circuit 13 receives write data from the outside and transmits the write data to the sense amplifier module 11, at the time of data writing.

The control circuit 14 controls operation of the entire NAND flash memory 1.

1.1.2 Memory Cell Array 10

Figure 2:
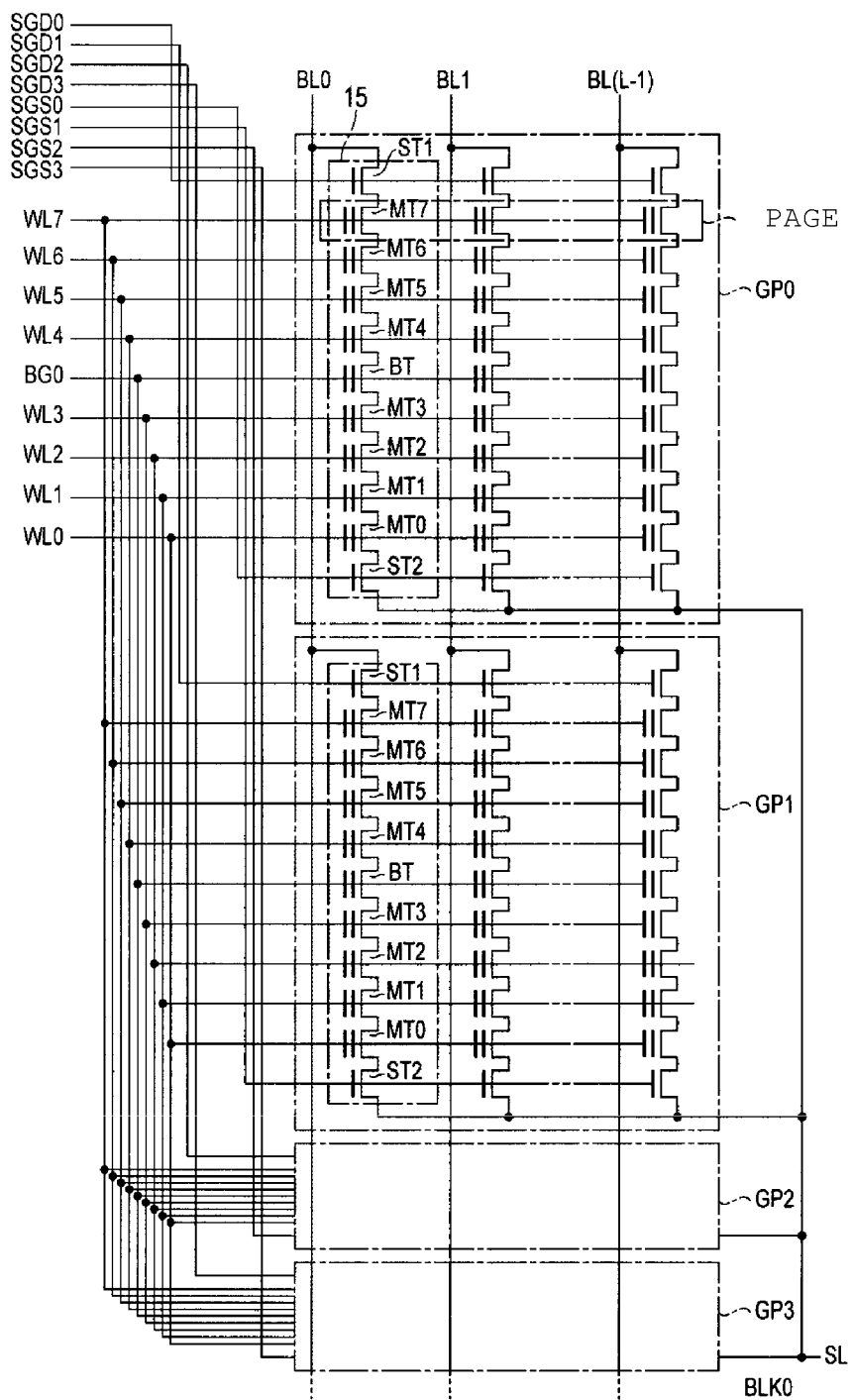
FIG. 2 is a circuit diagram of a memory cell array according to the first embodiment.

Next, a configuration of the memory cell array 10 is described in detail. FIG. 2 is a circuit diagram of the block BLK0. The other blocks BLK have the same configuration.

As illustrated, the block BLK0 includes multiple memory groups GP. Furthermore, each memory group GP includes multiple (in the present example, L units) NAND strings 15.

Each NAND string 15 includes, for example, eight memory cell transistors MT (MT0-MT7), selection transistors ST1, ST2 and a back gate transistor BT. The memory cell transistor MT includes a stacked layer gate including a control gate and an electric charge accumulation layer and retains data in a non-volatile state. Moreover, the number of the memory cell transistors MT is not limited to eight and may be 16, 32, 64, 128, or so forth. The number is not given any limitation. The back gate transistor BT, like the memory cell transistor MT, includes the stacked layer gate including the control gate and the electric charge accumulation layer. However, the back gate transistor BT is not for retaining the data, but functions to control an electric current path at the time of data writing and erasing. The memory cell transistor MT and the back gate transistor BT are arranged between the selection transistors ST1 and ST2 in such a manner that their electric current paths are connected in series. Moreover, the back gate transistor BT is provided between the memory cell transistors MT3 and MT4. The electric current path of the memory cell transistor MT7 at one end of this serial connection is connected to one end of the electric current path of the selection transistor ST1, and the electric current path of the memory cell transistor MT0 at the other end is connected to one end of the electric current path of the selection transistor ST2.

Gates of the selection transistors ST1 of the memory groups GP0 to GP(M−1) are commonly connected to select gate lines SGS0 to SGS(M−1), respectively, and gates of the selection transistors ST2 are commonly connected to the select gate lines SGS0 to SGS(M−1), respectively. In contrast, the control gates of the memory cell transistors MT0 to MT7 inside the same block BLK0 are commonly connected to word lines WL0 to WL7, respectively, and the control gates of the back gate transistors BT are commonly connected to back gate lines BG (BG0 to BG(N−1), respectively, in blocks BLK0 to BLK(N−1)).

That is, the word lines WL0 to WL7 and the back gate lines BG are commonly connected between the multiple memory groups GP inside the same block BKL0, and in contrast, the select gate lines SGD and SGS are independently provided for each memory group GP inside the same block BLK0.

Furthermore, among the NAND strings 15 that are arranged in the form of a matrix inside the memory cell array 10, the other end of the electric current path of the selection transistor ST1 of the NAND string 15s in the same column is commonly connected to the same bit line BL. That is, the bit line BL commonly connects the NAND string 15 among the multiple blocks BLK. Furthermore, the other end of the electric current path of the selection transistor ST2 is connected to a source line SL. The source line SL commonly connects the NAND string 15, for example, among the multiple memory groups GP.

The data inside the memory cell transistor MT in the same block BLK are erased as a whole unit. In contrast, data reading and data writing are performed with respect to multiple memory cell transistors MT that are commonly connected to any one of the word lines WL, in any one of the memory groups GP of any one of the blocks BLK. The unit of data reading and data writing is called a "page."

In the memory cell array 10 with the configuration described above, the memory cell transistor MT, the selection transistors ST1 and ST2 and the back gate transistor BT are stacked, in three dimensions, on the semiconductor substrate. As one example, one part of a peripheral circuit, such as the sense amplifier module 11, is formed on the semiconductor substrate, and the memory cell array 10 is formed above the peripheral circuit.

A configuration of the memory cell array 10 is disclosed, for example, in U.S. patent application Ser. No. 12/407,403, entitled "THREE DIMENSIONAL STACKED NONVOLATILE SEMICONDUCTOR MEMORY", filed on Mar. 19, 2009. Furthermore, the configuration is disclosed in U.S. patent application Ser. No. 12/406,524, entitled THREE DIMENSIONAL STACKED NONVOLATILE SEMICONDUCTOR MEMORY, filed on Mar. 18, 2009, U.S. patent application Ser. No. 12/679,991, entitled "NON-VOLATILE SEMICONDUCTOR MEMORY DEVICE AND METHOD FOR MANUFACTURING THE SAME", filed on Mar. 25, 2010, and U.S. patent application Ser. No. 12/532,030, entitled "SEMICONDUCTOR MEMORY AND METHOD FOR MANUFACTURING THE SAME", filed on Mar. 23, 2009. The U.S. Patent Applications described above are herein incorporated by reference in their entirety.

1.1.3 Sense Amplifier Module 11

Figure 3:
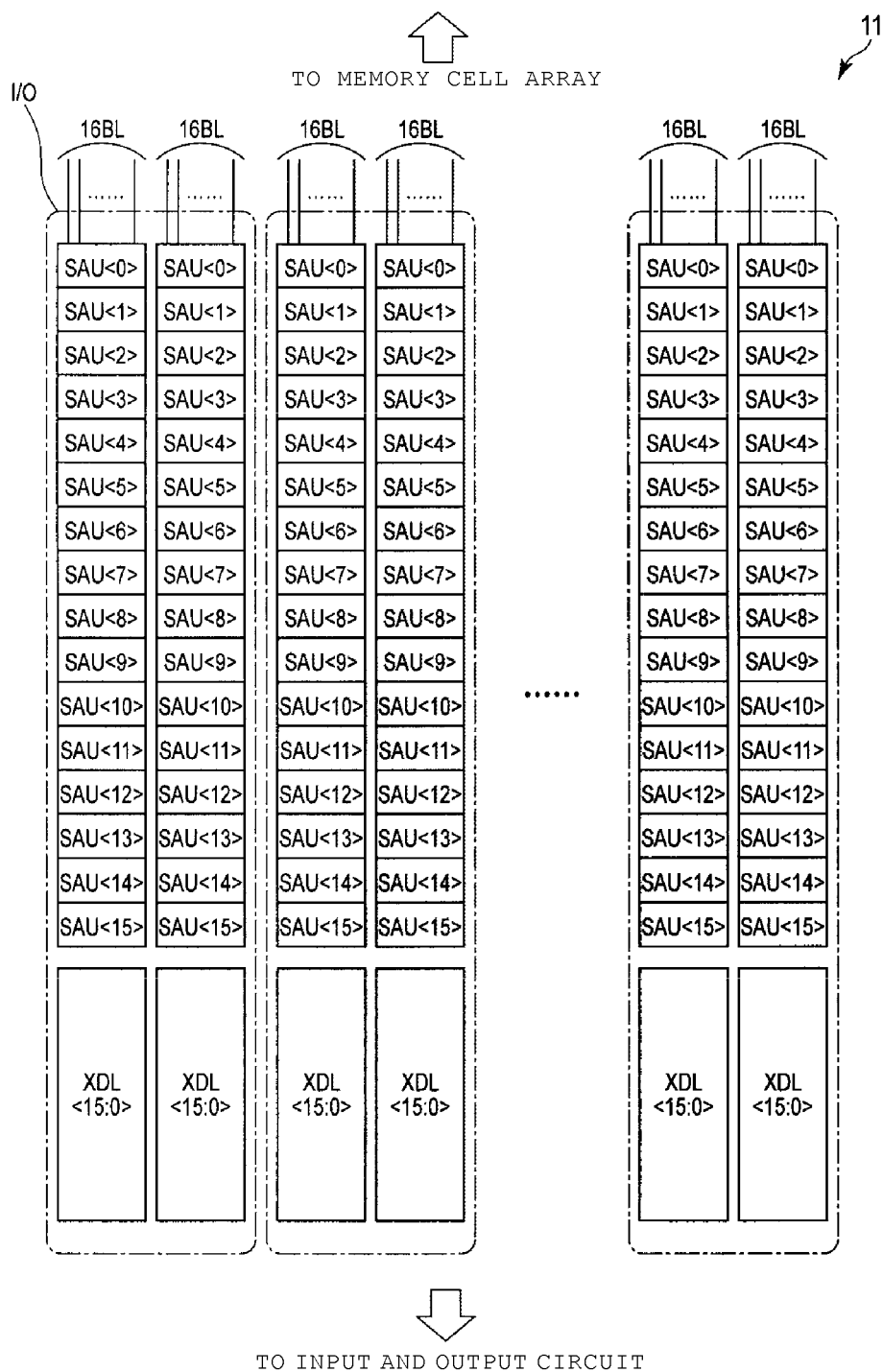
FIG. 3 is a block diagram of a sense amplifier module according to the first embodiment.

First, a configuration of the sense amplifier module 11 is described referring to FIG. 3. FIG. 3 is a schematic diagram illustrating a layout of the sense amplifier module 11, and illustrates, for example, an aspect when viewed from the upper surface of the semiconductor substrate.

The sense amplifier module 11, as illustrated, includes multiple sense amplifier units SAU and multiple latch circuits XDL.

One sense amplifier unit SAU is provided for each bit line BL, and senses/amplifies the data that is read into the corresponding bit line BL, and furthermore transmits the write data to the corresponding bit line BL. As one example, 16 sense amplifier units SAU are arranged in a line along the direction along the bit line BL. In the following description, SAU <0> to SAU <15> are used to respectively identify one sense amplifier unit among the 16 sense amplifier units.

One latch circuit XDL is also provided for each bit line BL, and temporarily retains the data relating to the corresponding bit line BL. The latch circuit XDL is used for cache operation of the NAND flash memory 1. That is, the multiple latch circuits (e.g. SDL, UDL, and LDL), described below, are included inside the sense amplifier unit SAU, and even though these latch circuits are in use, the NAND flash memory 1 can receive the data from the outside when the latch circuit XDL is empty. A set of 16 latch circuits XDL are provided (this is expressed as XDL <15:0> in FIG. 3), and they are arranged in a line with the 16 sense amplifier units SAU, which are also arranged in a line, along the direction of the bit line. One data input/output unit (I/O) corresponds to two lines of the sense amplifier units SAU and the latch circuits XDL, that is, 32 bit lines BL.

Figure 4:
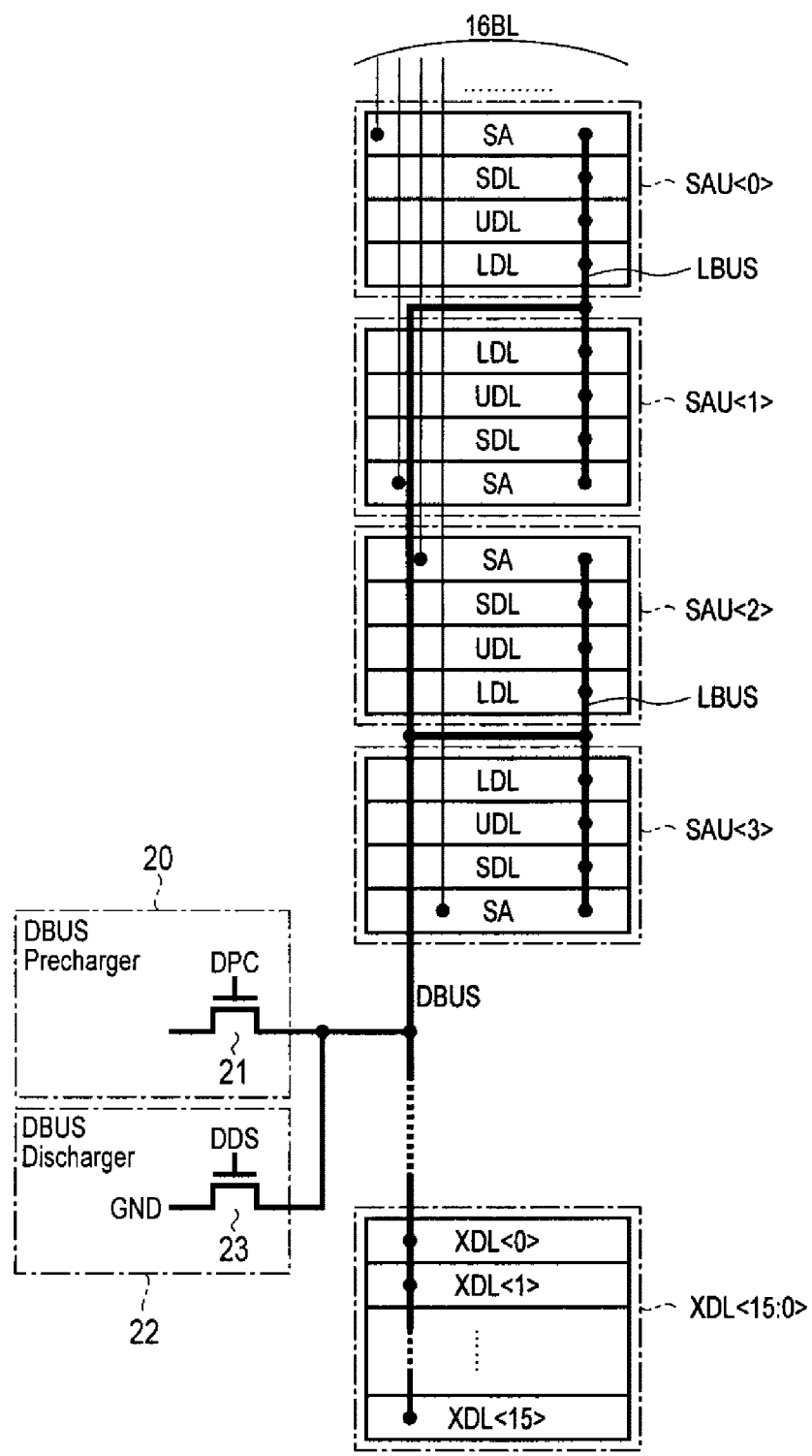
FIG. 4 is a block diagram of one region of the sense amplifier module according to the first embodiment.

FIG. 4 is a schematic diagram of a set of the sense amplifier units SAU and the latch circuits XDL that are arranged in a line, and illustrates the configuration of the sense amplifier module 11 in more detail.

In addition to the sense amplifier unit SAU and the latch circuit XDL, which are described above, the sense amplifier module 11, as illustrated, includes a bus LBUS, a charge circuit 20, and a discharge circuit 22.

Each of the sense amplifier unit SAU includes a sense amplifier section SA, and three latch circuits SDL, UDL, and LDL. The sense amplifier section SA senses/amplifies the data that is read into the bit line BL, and furthermore applies a voltage to the bit line BL depending on the write data. That is, the sense amplifier section SA is a module that directly controls the bit line BL. The latch circuits SDL, UDL and LDL retain data temporarily. At the time of data writing, the sense amplifier section SA controls the bit line BL depending on the data retained by the latch circuit SDL among the three latch circuits. The other latch circuits UDL and LDL are used for a multi-value operation in which the individual memory cell transistor retains two or more bit data, or are used to perform a so-called quick pass write operation.

In each sense amplifier unit SAU, the sense amplifier section SA, and the three latch circuits SDL, UDL, and LDL are connected by the bus LBUS in a manner that enables them to mutually transmit and receive the data. In an example in FIG. 4, the bus LBUS is commonly connected between the two sense amplifier units SAU that are adjacent in the bit line direction and is arranged in such a manner as to cross the two sense amplifier units SAU in the direction along the bit line. Therefore, 8 buses LBUS are provided for every 16 sense amplifier units SAU <15:0>.

A bus DBUS connects the sense amplifier unit SAU and the corresponding latch circuit XDL in a manner that enables them to mutually transmit and receive the data. In the example in FIG. 4, the 16 sense amplifier units SAU, arranged in a line, share one data bus.

The charge circuit 20 charges the bus DBUS. The charge circuit 20 includes, for example, a low-resistance-to-voltage n channel MOS transistor 21, one end of the electric current path is connected to the bus DBUS, and a control signal DPC is applied to a gate.

The discharge circuit 22 discharges the bus DBUS. The discharge circuit 22 includes, for example, a low-resistance-to-voltage n channel MOS transistor 23, one end of the electric current path is connected to the bus DBUS, the other end is grounded (GND), and a control signal DDS is applied to a gate.

Figure 5:
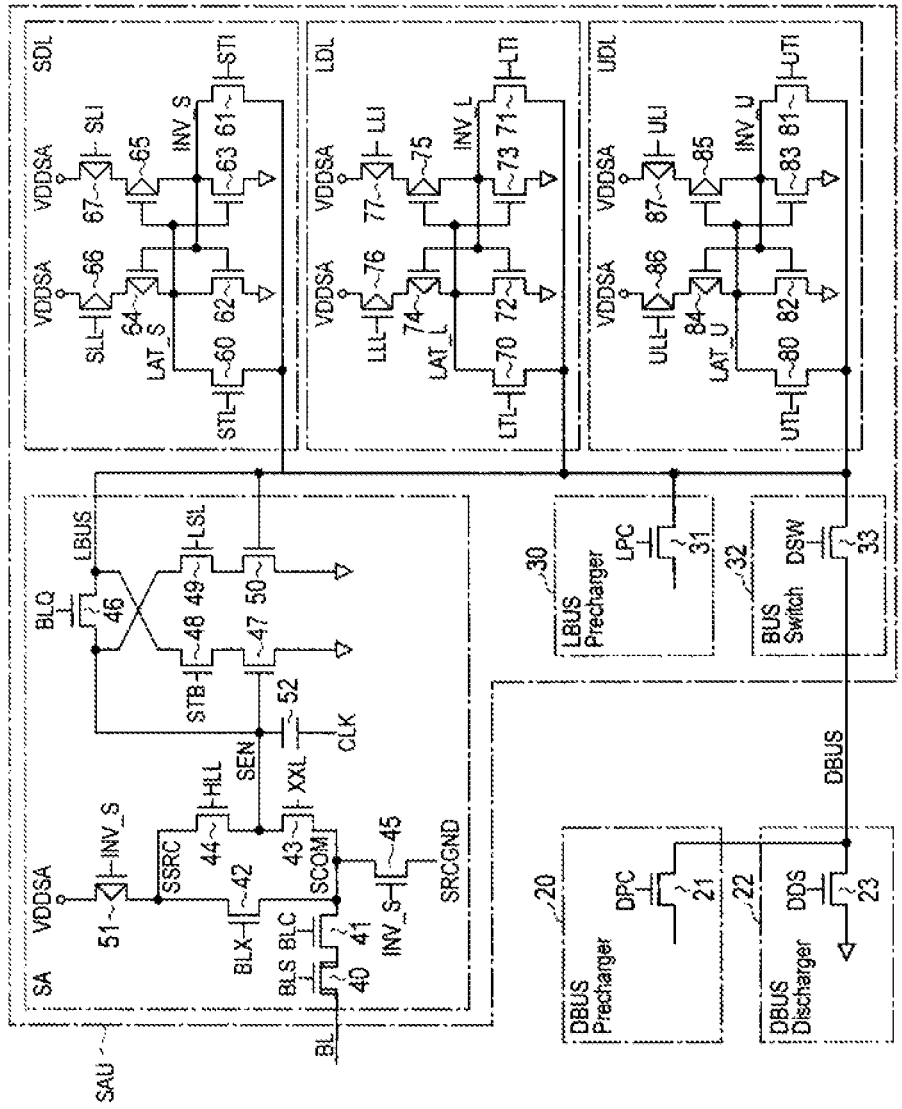
FIG. 5 is a circuit diagram of a sense amplifier unit according to the first embodiment.

FIG. 5 is a circuit diagram of the sense amplifier unit SAU and more specifically illustrates a configuration of the sense amplifier unit SAU.

The sense amplifier unit SAU, as described above, includes the sense amplifier section SA, and the three latch circuits SDL, LDL, and UDL. The sense amplifier unit SAU further includes a charge circuit 30 and a bus switch 32.

The charge circuit 30 charges the bus LBUS. The charge circuit 30 includes, for example, a low-resistance-to-voltage n channel MOS transistor 31, one end of the electric current path is connected to the bus LBUS, and a control signal LPC is applied to a gate. Then, the charge circuit 30 charges the bus LBUS to a voltage lower than a power source voltage VDDSA used in the sense amplifier unit SAU.

The bus switch 32 connects the bus DBUS and the bus LBUS. That is, the bus switch 32 includes, for example, a low-resistance-to-voltage n channel MOS transistor 33, and in the bus switch 32, one end of the electric current path is connected to the bus DBUS, the other end is connected to the bus LBUS, and a control signal DSW is applied to a gate.

Next, configurations of the sense amplifier section SA and the latch circuits SDL, LDL, and UDL are described.

The sense amplifier section SA includes a high-resistance-to-voltage n channel MOS transistor 40, low-resistance-to-voltage n channel MOS transistors 41 to 50, a low-resistance-to-voltage p channel MOS transistor 51, and a capacitor element 52.

A signal BLS is applied to a gate of the transistor 40, and one end of the electric current path is connected to the corresponding bit line BL. In the transistor 41, one end of the electric current path is connected to the other end of the electric current path of the transistor 40, a signal BLC is applied to a gate, and the other end of the electric current path is connected to a node SCOM. The transistor 41 clamps the corresponding bit line BL to an electric potential depending on the signal BLC.

In the transistor 45, one end of the electric current path is connected to the node SCOM, the other end is connected to a node SRCGND (for example, 0 V), and a gate is connected to a node INV_S. In the transistor 42, one end of the electric current path is connected to the node SCOM, the other end is connected to a node SSRC, and a control signal BLX is input to a gate. In the transistor 51, one end of the electric current path is connected to a node SSRC, a power source voltage VDDSA is applied to the other end, and a gate is connected to the node INV_S. In the transistor 43, one end of the electric current path is connected to the node SCOM, the other end is connected to a node SEN, and a control signal XXL is input to a gate. In the transistor 44, one end of the electric current path is connected to the node SSRC, the other end is connected to the node SEN, and a control signal HLL is input to a gate. In the capacitor element 52, one electrode is connected to the node SEN, and a clock CLK is input to the other electrode. In the transistor 47, one end of the electric current path is grounded, and a gate is connected to the node SEN. In the transistor 48, one end of the electric current path is connected to the other end of the electric current path of the transistor 47, the other end is connected to the bus LBUS, and a control signal STB is input to a gate.

In the transistor 46, one end of the electric current path is connected to the node SEN, the other end is connected to the bus LBUS, and a control signal BLQ is input to a gate. In the transistor 50, one end of the electric current path is grounded, and a gate is connected to the bus LBUS. In the transistor 49, one end of the electric current path is connected to the other end of the electric current path of the transistor 50, the other end is connected to the node SEN, and a control signal LSL is input to a gate.

Next, the latch circuit SDL is described. The latch circuit SDL, as illustrated in FIG. 5, includes low-resistance-to-voltage n channel MOS transistors 60 to 63 and low-resistance-to-voltage p channel MOS transistors 64 to 67.

In the transistor 60, one end of the electric current path is connected to the bus LBUS, the other end is connected to a node LAT_S, and a control signal STL is input to a gate. In the transistor 61, one end of the electric current path is connected to the bus LBUS, the other end is connected to a node INV_S, and a control signal STI is input to a gate. In the transistor 62, one end of the electric current path is grounded, the other end is connected to a node LST_S, and a gate is connected to the node INV_S. In the transistor 63, one end of the electric current path is grounded, the other end is connected to the node INV_S, and a gate is connected to a node LAT_S. In the transistor 64, one end of the electric current path is connected to the node LST_S, and a gate is connected to the node INV_S. In the transistor 65, one end of the electric current path is connected to the node INV_S, and a gate is connected to the node LAT_S. In the transistor 66, one end of the electric current path is connected to the other end of the electric current path of the transistor 64, the power source voltage VDDSA is applied to the other end, and a control signal SLL is input to a gate. In the transistor 67, one end of the electric current path is connected to the other end of the electric current path of the transistor 65, the power source voltage VDDSA is applied to the other end, and a control signal SLI is input to a gate.

In the latch circuit SDL, a first inverter is configured from the transistors 62 and 64, and a second inverter is configured from the transistors 63 and 65. Then, an output of the first inverter and an input of the second inverter (the node LAT_S) are connected to the bus LBUS via the transistor 60 for data transmission, and an input of the first inverter and an output of the second inverter (the node INV_S) are connected to the bus LBUS via the transistor 61 for data transmission. The latch circuit SDL retains data in the node LAT_S and retains its inversion data in the node INV_S.

Because the latch circuits LDL and UDL have the same configuration as the latch circuit SDL, the description is omitted, but a reference numeral and a control signal name of each transistor are described below in such a manner as to be distinguishable from the reference numeral and the control signal name of the latch circuit SDL as in FIG. 5.

Next, operation of the sense amplifier unit SAU with the configuration described above is briefly described. First, a data writing operation is described. If data is written to the memory cell transistor MT (if a threshold is increased by injecting an electric charge), an "H" level (data "1") is stored in the node INV_S of the latch circuit SDL. As a result, the transistor 45 is set to an ON state and the bit line BL is set to 0 V. On the other hand, if data is not written to the memory cell transistor MT (if the threshold is not changed with no electric charge being injected), an "L" level (data "0") is stored in the node INV_S of the latch circuit SDL. As a result, the transistor 51 is set to an ON state, and a predetermined positive voltage is applied to the bit line BL.

Next, a read operation is described. At the time of read, first, the node INV_S is set to an "L" level and the transistor 51 is set to the ON state. Then, the bit line BL is charged by the transistor 51 via the transistors 40 to 42. Furthermore, the transistor 44 is also set to the ON state, and the node SEN is charged up to a predetermined electric potential.

Thereafter, the transistor 44 is set to the OFF state, the signal XXL is at the "H" level and thus the transistor 43 is set to the ON state. Then, if the corresponding memory cell is in the ON state, the electric potential of the node SEN is decreased, and the transistor 47 is in the OFF state. On the other hand, if the corresponding memory cell is in the OFF state, the electric potential of the node SEN maintains the "H" level, and as a result, the transistor 47 is in the ON state.

Then, the signal STB is set to the ON state, the electric potential that depends on the ON/OFF state of the transistor 47 is read into the bus LBUS and is retained in any one of the latch circuits SDL, LDL, and UDL.

Figure 6:
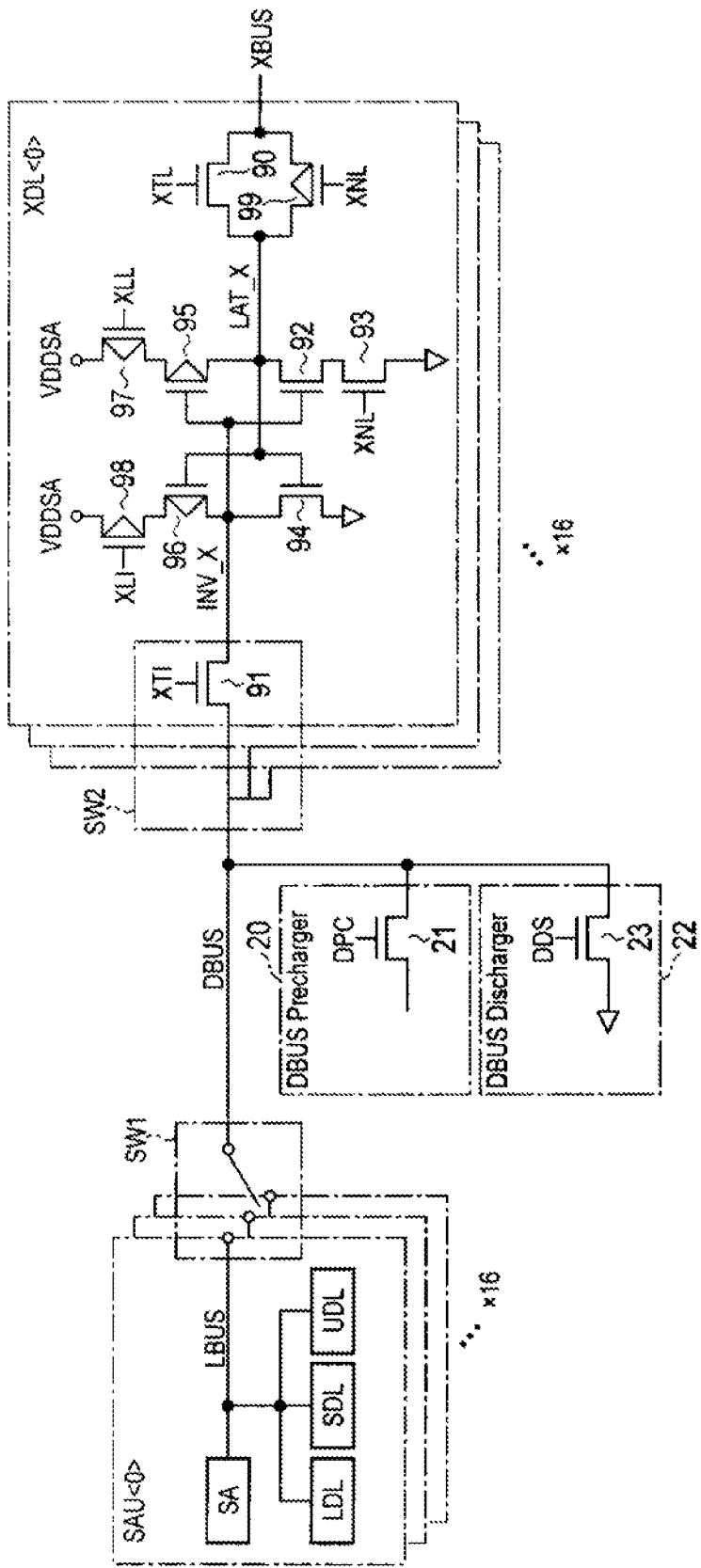
FIG. 6 is a circuit diagram of a latch circuit according to the first embodiment.

Next, a configuration of the latch circuit XDL is described referring to FIG. 6. FIG. 6 is a schematic diagram illustrating a circuit configuration of the latch circuit XDL and illustrating a connection relationship between the sense amplifier module SAU and the latch circuit XDL.

The latch circuit XDL, as illustrated, includes low-resistance-to-voltage n channel MOS transistors 90 to 94 and low-resistance-to-voltage p channel MOS transistors 95 to 99.

In the transistor 90, one end of the electric current path is connected to the bus XBUS that is connected to the input and output circuit 13, the other end is connected to a node LAT_X, and a control signal XTL is input to a gate. In the transistor 91, one end of the electric current path is connected to the bus DBUS, the other end is connected to a node INV_X, and a control signal XTI is input to a gate. In the transistor 92, one end of the electric current path is connected to the node LAT_X, and a gate is connected to the node INV_X. In the transistor 93, one end of the electric current path is grounded, the other end is connected to the other end of the electric current path of the transistor 92, and a control signal XNL is input to a gate. In the transistor 95, one end of the electric current path is connected to the node LAT_X, and a gate is connected to the node INV_X. In the transistor 96, one end of the electric current path is connected to the node INV_X, and a gate is connected to the node LAT_X. In the transistor 97, one end of the electric current path is connected to the other end of the electric current path of the transistor 95, the power source voltage VDDSA is applied to the other end, and a control signal XLL is input to a gate. In the transistor 98, one end of the electric current path is connected to the other end of the electric current path of the transistor 96, the power source voltage VDDSA is applied to the other end, and a control signal XLI is input to a gate.

In this manner, the latch circuit XDL also has the substantially same configuration as the latch circuit SDL and the like, but the latch circuit XDL retains the data between the bus DBUS and the bus XBUS.

Furthermore, as described above, in the present example, the 16 sense amplifier modules SAU <15:0> and the 16 latch circuits XDL <15:0> are connected by one bus DBUS. A connection between the sense amplifier unit SAU and the bus DBUS is switched on and off by a first switch SW1, and a connection between the latch circuit XDL and the bus DBUS is switched on and off by a second switch SW2. Therefore, the data transmission between the latch circuit XDL and the sense amplifier unit is performed by 16 time division transmission operations.

1.2 Operation of Transmitting Data Between Latches Inside Sense Amplifier Unit

Figure 7:
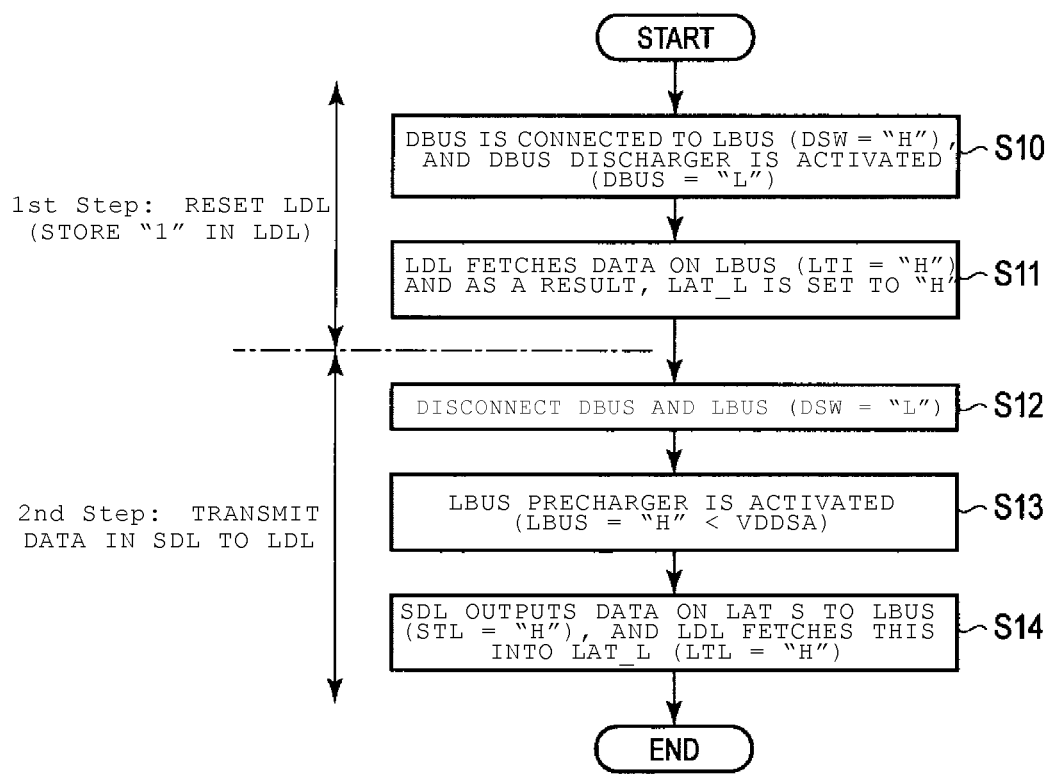
FIG. 7 is a flowchart of a method of transmitting data according to the first embodiment.
Figure 8:
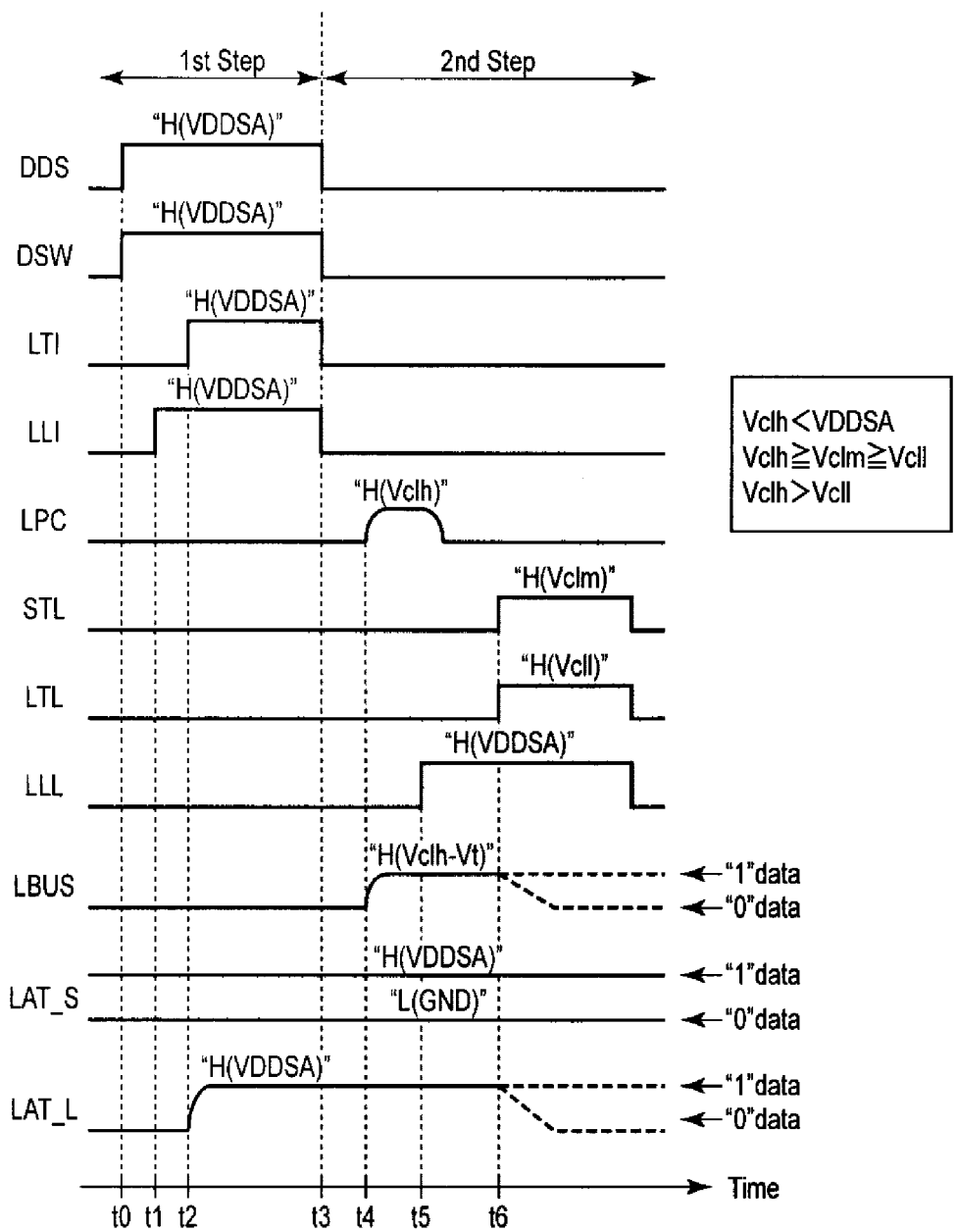
FIG. 8 is a timing chart of various signals at the time of data transmission according to the first embodiment.

Next, an operation of transmitting data among the latch circuits SDL, LDL, and UDL according to the present embodiment is described. A case where the data is transmitted from the latch circuit SDL to the latch circuit LDL is described below as one example, referring to FIG. 7 and FIG. 8. FIG. 7 is a flowchart at the time of data transmission operation, and FIG. 8 is a timing chart for the various signals at that time.

As illustrated, the data transmission operation from SDL to LDL generally includes two steps. The first step is an operation of resetting LDL and an operation of storing data "1" in LDL. Next, the second step is an operation of actually transmitting the data from SDL to LDL. The operation described below is performed, for example, under the control of the control circuit 14, and the various control signals described referring to FIG. 5 and FIG. 6 are included, for example, in the control signal 14.

As illustrated in FIG. 7, the control circuit 14 first sets the signal DSW to the "H" level, and thus connects the bus DBUS to any one of the buses LBUS. Moreover, the control circuit 14 sets the signal DDS to the "H" level, and discharges the bus DBUS and the LBUS (Step S10 and a point in time t0). Because of this, electric potentials of the bus DBUS and the LBUS are at approximately 0 V. Additionally, the electric potentials of the signals DSW and DDS, which are set to the "H" level, are VDDSA, the power source voltage of the latch circuits SDL, LDL, UDL. In the present specification, the same is true for the other control signals, except as described specifically otherwise.

Figure 9:
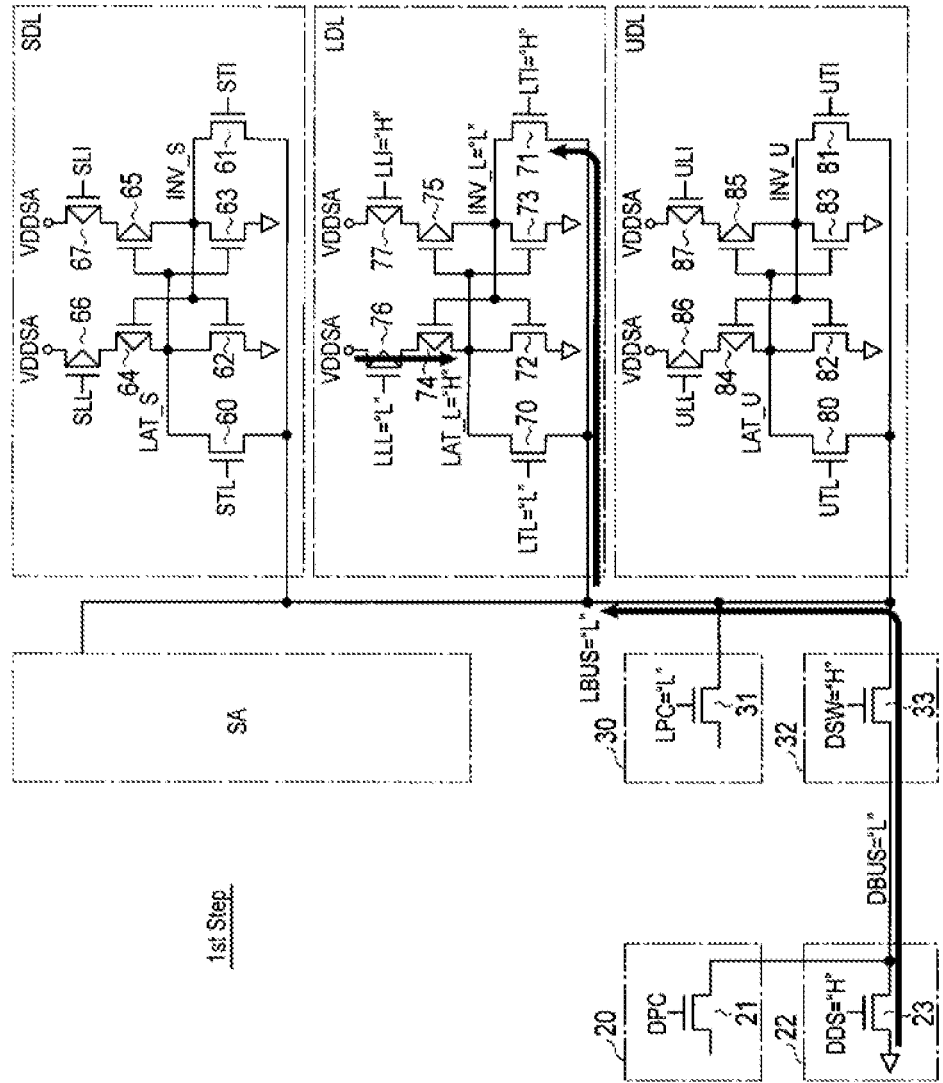
FIG. 9 is a circuit diagram of the sense amplifier unit according to the first embodiment.

Next, LDL, a data transmission destination, fetches the data on the bus LBUS (Step S11). That is, the control circuit 14 sets the signals LLL and LLI to the "L" level and to the "H" level, respectively, (a point in time t1), and thus the transistors 76 and 77 are set to the ON state and the OFF state, respectively, (the point in time t1). Subsequently, the control circuit 14 sets the signal LTI to the "H" level (a point in time t2). The state of the SAU at this time is illustrated in FIG. 9, the circuit diagram. As illustrated, the transistor 71 is in the ON state, and the electric potential of the bus LBUS is brought into LDL. That is, the node INV_L is at the "L" level, and the node LAT_L is set to the "H" level (VDDSA).

Figure 10:
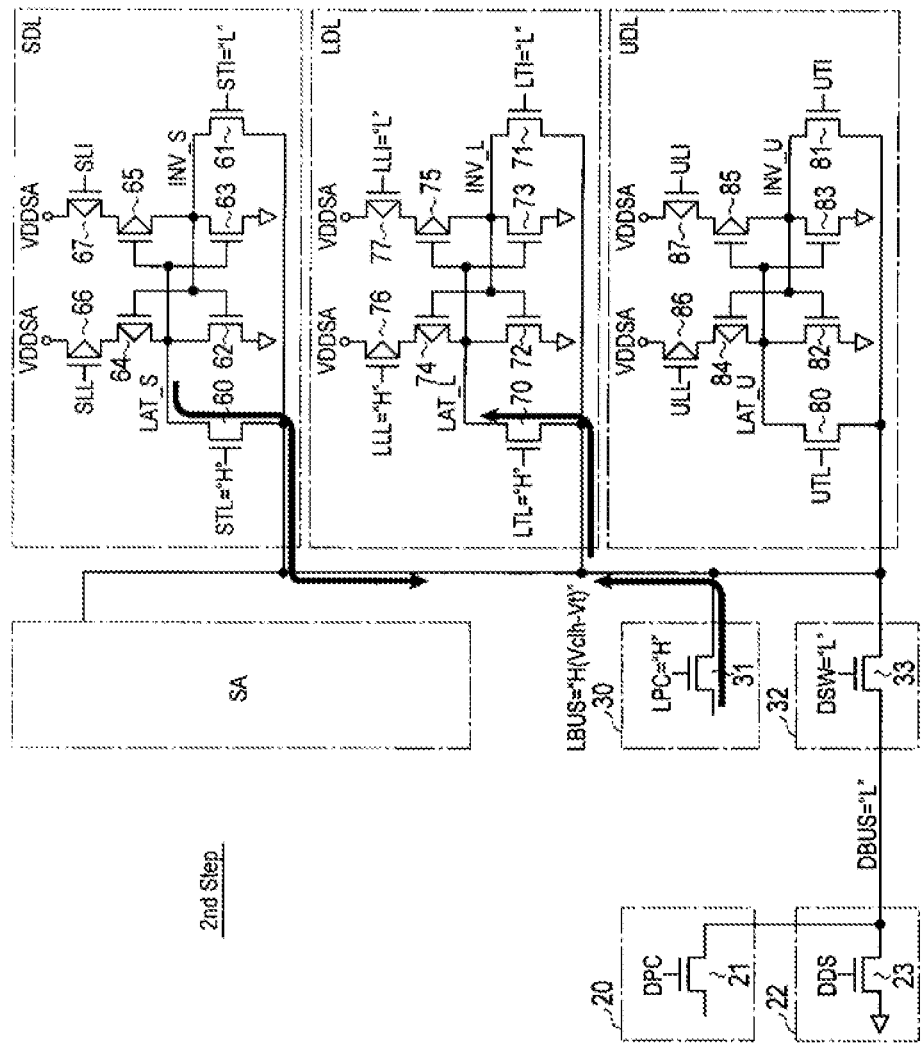
FIG. 10 is a circuit diagram of the sense amplifier unit according to the first embodiment.

When the first step as described above is completed, the control circuit 14 subsequently proceeds to the second step. The second step is described below, further referring to the circuit diagram of FIG. 10.

First, the control circuit 14 sets the signal DSW to the "L" level, and separates DBUS from LBUS (Step S12 and a point in time t3). Subsequently, the control circuit 14 sets the signal LPC to the "H" level, and charges the bus LBUS (Step S13 and a point in time t4). At this time, the control circuit 14 controls the transistor 31 in such a manner that the electric potential of the bus LBUS is at (Vclh−Vt). (Vclh−Vt), for example, is approximately 0.5 to 1 V. The voltage Vclh is a voltage that is smaller than power source voltage VDDSA of the sense amplifier unit SAU, and Vt is a threshold voltage of the low-resistance-to-voltage n channel transistor (for example, the transistors 31, 60, 61, 70, 71, 80, 81 and so forth) inside the sense amplifier unit SAU. Because of this, for example, the control circuit 14 sets the electric potential of the signal LPC to Vclh. Because of this the electric potential of the bus LBUS is clamped to (Vclh−Vt). Otherwise, the electric potential of the signal LPC may be sufficiently increased and Vclh may be applied to the other end of the electric current path of the transistor 31.

Next, SDL outputs retention data on to the bus LBUS, and LDL fetches the retention data (Step S14). That is, the control circuit 14 sets the signal LLL to the "H" level during a period when the signal LPC is set to the "H" level (a point in time t5). Because of this, the electric potential of the node LAT_L of LDL is set to a state of floating at VDDSA. Then, the control circuit 14 sets the signals STL and LTL to the "H" level after setting the signal LPC to the "L" level (a point in time t6). Moreover, electric potentials Vclm and Vcll of the signals STL and LTL are also made smaller than VDDSA. Moreover, the relation to Vclh is as follows.

$$Vclh \geq Vclm \geq Vcll$$

$$Vclh > Vcll$$

where Vclh≥Vclm (preferably, Vclh>Vclm) is a condition for SDL to stabilize and thus retain the data "1", and Vclh≥Vcll (preferably, Vclh>Vcll) is a condition for LDL to stabilize and thus retain the data "1". That is, the reason is as follows. If SDL and LDL retain the "H" level, when a gate voltage of the transmission transistors 60 and 70 is excessively high, there is concern that the transistors will be in the ON state, and the retention data in the SDL and LDL will be damaged.

Furthermore, as one example, values of Vclh, Vclm, and Vcll are set as follows.

$$Vclh = 1V + Vt$$

$$Vclm = 0.75V + Vt$$

$$Vcll = 0.5V + Vt$$

The signal STL is set to the "H" level, and thus the electric potential of the bus LBUS changes depending on the retention data in SDL (the data in LAT_S). When SDL retains the data "1", the transistor 60 is in a cut-off state, and the electric potential of the bus LBUS maintains the "H" level (Vclh−Vt). On the other hand, when SDL retains the data "0", the transistor 60 is in the ON state, and the electric potential of the bus LBUS transitions to the "L" level (0 V) (the point in time t6).

Furthermore, the signal LTL is set to the "H" level (Vcll). Consequently, when the bus LBUS transitions to the "L" level (0 V), the transistor 70 is in the ON state, and the "L" level is stored in the node LAT_L. On the other hand, when the bus LBUS maintains the "H" level (Vclh−Vt), the transistor 70 is still in the OFF state. Therefore, the node LAT_L continues to retain the "H" level (VDDSA).

In this manner, the data "1" is made to be retained in the transmission destination, the latch circuit, and thereafter the transmission destination, the latch circuit, outputs the data. At this time, if the transmission data is "0", an input switch (the transistor 70) of the transmission destination, the latch circuit, is turned on, and thus the data "0" is transmitted to the transmission destination, the latch circuit. On the other hand, if the transmission data is "1", the input switch is turned off, and thus the transmission destination, the latch circuit is set to an unchangeable state.

1.3 Effects According to Present Embodiment

When the configuration according to the first embodiment is provided, reliability of operation of the NAND flash memory 1 can be improved. The present effect is described below.

As described above, in the NAND flash memory, a bit line control section (the sense amplifier section SA in FIG. 4) that directly controls the electric potential of the bit line, and multiple data latches (SDL, UDL, LDL, and XDL in FIG. 4) are provided for one bit line. The number of necessary data latches changes depending on the multi-value extent of the cell, the presence or absence of the cache operation, or whether or not the high speed operation is supported, but is generally 3 to 5. The data transmission between the data latches is performed via the data bus line (LBUS and DBUS in FIG. 4). At this time, the data bus line undergoes a considerable amount of charging and discharging. The reasons for that are that several KB sense amplifier and data latches are present inside the chip and several KB data bus line operates at the time of data transmission, and additionally because a wiring length of the data bus line is long and a wiring interval is narrow, a parasitic capacitance is increased and thus charging/discharging is necessary to be performed and enormous load capacity is handled in total. This problem is more serious as device sizes reduces even further, and also an architecture in which the sense amplifier is arranged under the memory cell array has the same problem as the NAND flash memory in which the memory cells are stacked in three dimensions.

In view of the situation described above, according to the present embodiment, power consumption is reduced by attempting to make data bus low in amplitude and thus reducing the amount of charging/discharging of the data bus. More specifically, while maintaining VDDSA as the power source of the data latch itself, the data bus is amplified with a voltage (Vclh−Vt) that is smaller than VDDSA, without using VDDSA. At this time, the gate electric potential of the transistor 31 that charges the data bus may be set to a predetermined voltage (for example, Vclh) that is lower than VDDSA and thus may clamp the electric potential of the data bus to (Vclh−Vt), or may use a transmission gate type that transmits this clamp voltage. As a result, the power consumption in the data bus can be reduced to ½ to ¼ of the previous power consumption.

Furthermore, at the same time, the gate electric potential of the transmission transistor (the transistors 60, 61, 70, 71, 80, and 81 in FIG. 5) of the data latch is set to a predetermined voltage (for example, Vclm and Vcll) that is lower than VDDSA. Because of this, a malfunction of the transmission transistor due to a decrease in the charge voltage of the data bus can be prevented and operational stability of the data latch can be improved.

2. Second Embodiment

Next, a semiconductor memory device according to a second embodiment is described. In the present embodiment, the charge on the bus LBUS is carried out by a transmission destination, a latch circuit, without using a charge circuit 30 of the first embodiment described above. Only the parts of the present embodiment that differ from the first embodiment are described below.

Figure 11:
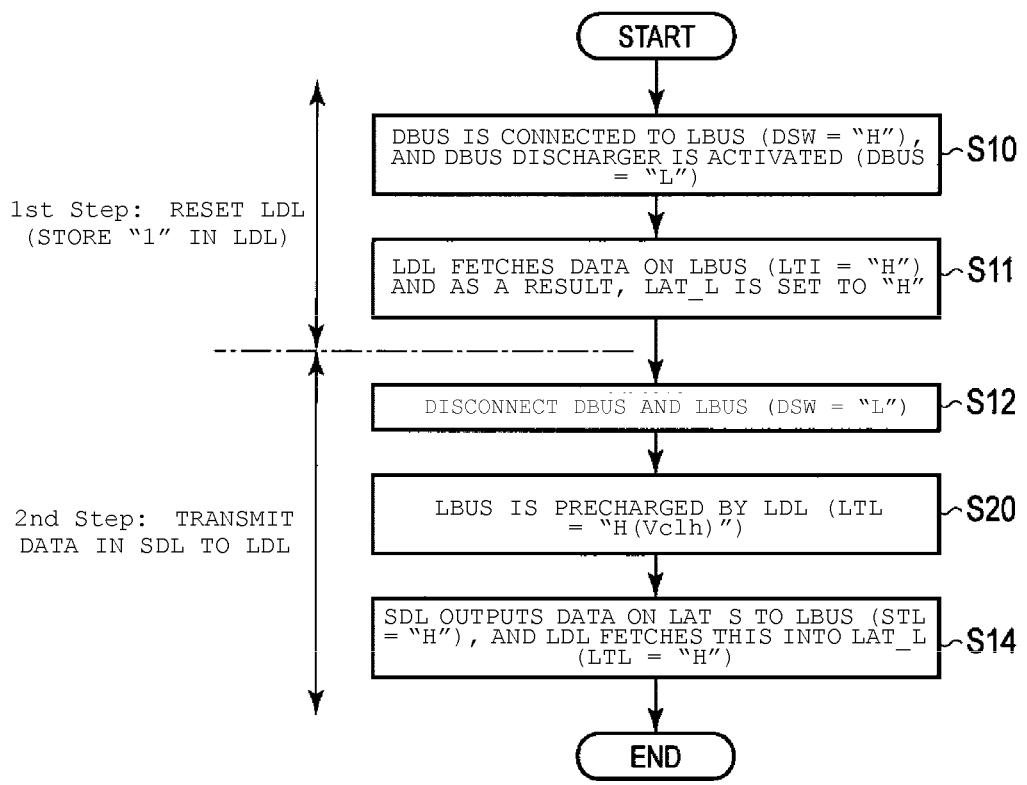
FIG. 11 is a flowchart of a method of transmitting data according to a second embodiment.
Figure 12:
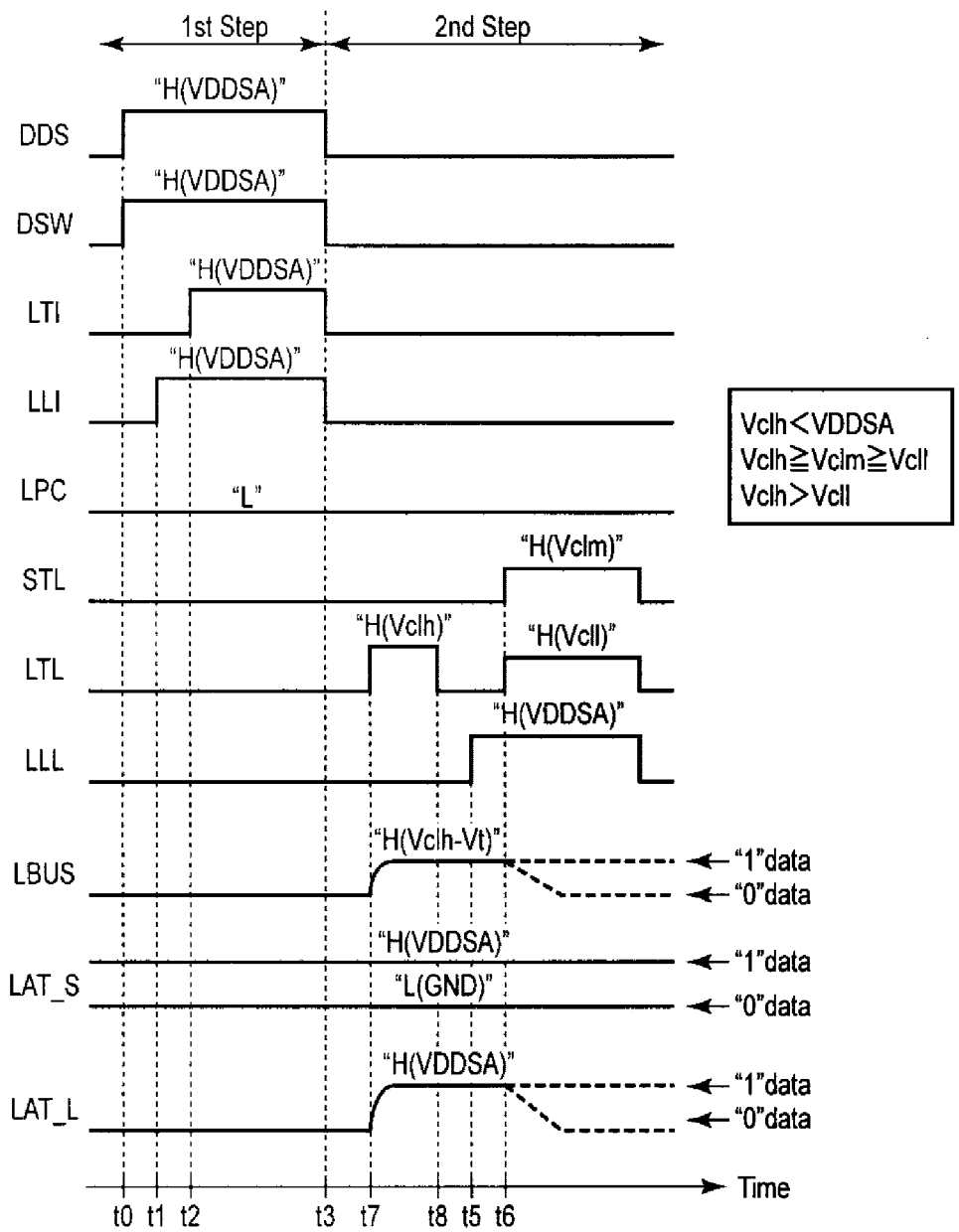
FIG. 12 is a timing chart of various signals at the time of data transmission according to the second embodiment.

2.1 Operation of Transmitting Data Between Latches Inside Sensor Amplifier Unit Data transmission operation according to the present embodiment is described. A case where data is transmitted from a latch circuit SDL to a latch circuit LDL in the same manner as in the first embodiment is described below as one example, referring to FIG. 11 and FIG. 12. FIG. 11 is a flowchart at the time of data transmission operation, and FIG. 12 is a timing chart for various signals at that time.

Figure 13:
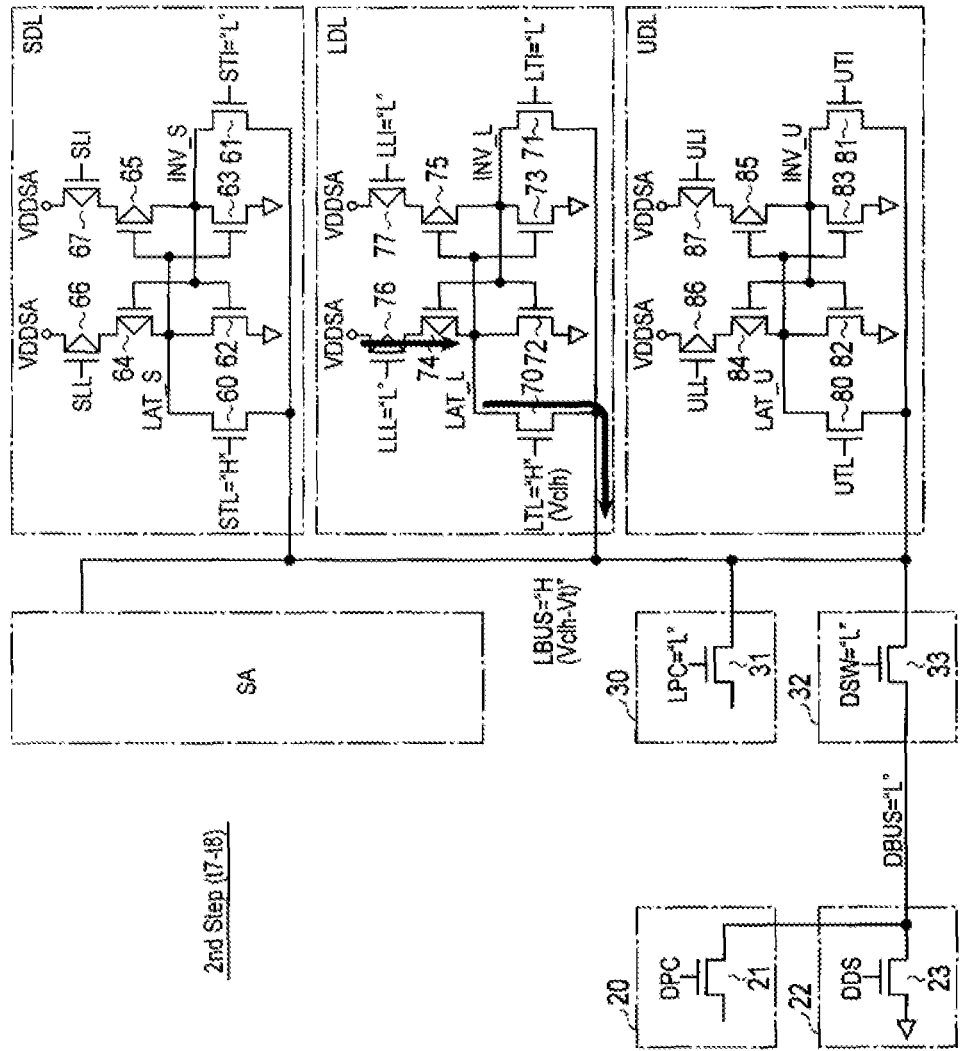
FIG. 13 is a circuit diagram of a sense amplifier unit according to the second embodiment.

As illustrated, after Steps S10 to S12 described in the first embodiment, a control circuit 14 charges a bus LBUS by LDL (Step S20 and at time t7). This feature is illustrated in FIG. 13, a circuit diagram. FIG. 13 is a circuit diagram of a sense amplifier module during a period of time from time t7 to time t8 in FIG. 12. That is, the control circuit 14 sets a signal LTL to an "H" level with a signal LPC being set to an "L" level. An electric potential of the signal LTL is set to Vclh described in the first embodiment. Then, because transistors 74 and 76 are set to an ON state and thus a node LAT_L is substantially VDDSA, an electric potential of the bus LBUS is clamped to (Vclh−Vt) by a transistor 70. (Vclh−Vt), for example, is 0.5 V to 1 V.

After the signal LTL is set to an "L" level at time t8, operation of the signal LTL is the same as that in the first embodiment.

2.2 Effect According to Present Embodiment

According to the present embodiment, reliability of operation of the NAND flash memory can be further improved. As illustrated in the first embodiment, as a data bus line is made lower in amplitude, power consumption is reduced even more. However, on the other hand, when low amplification is excessive, there is a likelihood that a data change defect will take place, for example, by variance in a threshold of a transistor that determines a charge level of a data line and variance in a threshold of a transistor of a latch, a data receiver.

Figure 14:
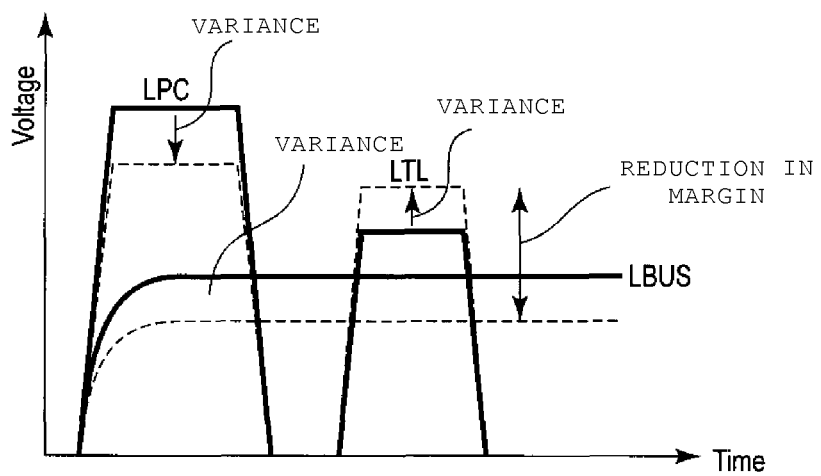
FIG. 14 is a graph showing electric potentials of LBUS, LPC, and LTL.
Figure 15:
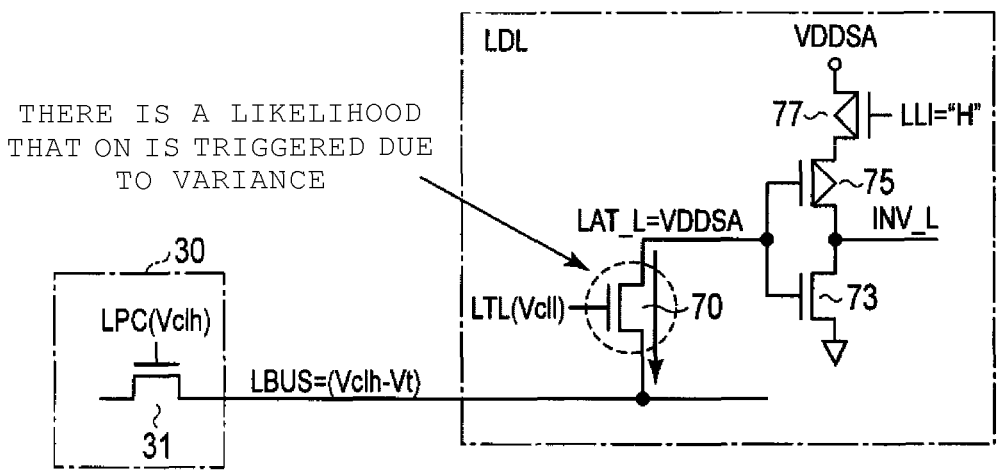
FIG. 15 is a circuit diagram of one region of the sense amplifier module.

In the present embodiment, an occurrence of this type of defect can be prevented. The present effect is described referring to FIG. 14 and FIG. 15. FIG. 14 is a graph illustrating electric potentials of the signals LPC and LTL, and the bus LBUS, and FIG. 15 is a circuit diagram of one region of a sense amplifier unit SAU.

If charge of the bus LBUS is performed with voltage clamp by the charge circuit 30, the electric potential of the bus LBUS is influenced by the electric potential of the signal LPC. For example, as illustrated in FIG. 14, the fact that a threshold of a transistor 31 for LBUS charge varies among high values means that the electric potential of the signal LPC is decreased, and as a result, the electric potential of the bus LBUS is also decreased. Furthermore, the fact that a threshold of the transistor 70 of the latch circuit LDL varies among low values means that the signal LTL is increased. In this manner, when a situation occurs in which the electric potential of the bus LBUS is decreased, and the electric potential of the signal LTL is increased, there is a likelihood that the transistor 70 will be erroneously in the ON state. When the transistor 70 is in the ON state, there is concern that a voltage VDDSA retained in the node LAT_L will drop into the bus LBUS, and LDL will lose data.

Accordingly, the method according to the present embodiment can solve the problem described above by performing the charge on the bus LBUS with the latch circuit, the data receiver. That is, as described in FIG. 12, during the period of time from time t7 to time t8, the bus LBUS is charged by the transistor 70. Even if the electric potential of LBUS is set to a low value due to the variance in the threshold of the transistor 70, when the signal LTL is set to the "H" level thereafter, an effect that the signal LTL is decreased due to the variance in the threshold can be obtained. In other words, an influence of the variance in the threshold on the LBUS charge and an influence of the variance in the threshold on the data transmission are offset against each other. In this manner, a decrease in the reliability of operation due to the variance in the threshold of the transistor can be prevented.

Figure 16:
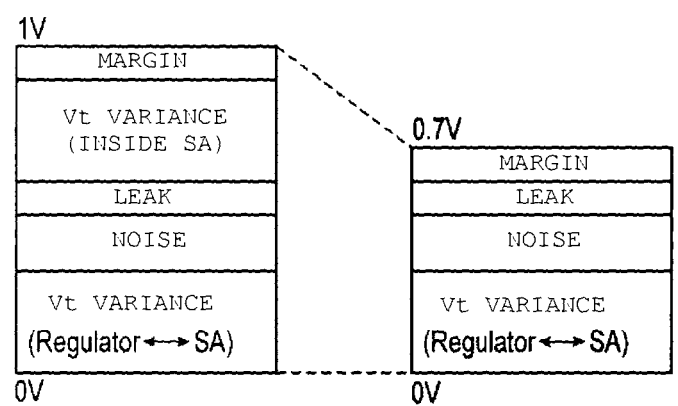
FIG. 16 is a schematic diagram illustrating a detail of a minimum electric potential of a bus.

Furthermore, the method according to the present embodiment can reduce the charge level of the bus LBUS. Because of this, the power consumption can be reduced. FIG. 16 is a graph making a comparison between the charge levels of the buses LBUS according to the first embodiment and the second embodiment.

As illustrated, in the method according to the first embodiment, the charge level is, for example, 1 V. The charge level is broken down into a variance in a threshold of the transistor in a path between a regulator supplying various voltages and the sense amplifier unit SAU, noise, a leak, a variance in a threshold of the transistor inside the sense amplifier unit SAU, and a margin. In this regard, according to the present embodiment, for the reason described above, there is no need to take into consideration the variance in the threshold of the transistor inside the sense amplifier unit SAU. As a result, the charge level can be set to, for example, approximately 0.7 V, which is lower than in the first embodiment.

3.3 Third Embodiment

Next, a semiconductor memory device according to a third embodiment is described. The present embodiment results from the charge circuit 30 assisting charge of a bus LBUS in the second embodiment described above. In other words, the present embodiment is equivalent to making an electric potential of a signal LPC smaller than Vclh with the first and second embodiments being combined. Only the parts of the present embodiment which differ from the first and second embodiments are described below.

Figure 17:
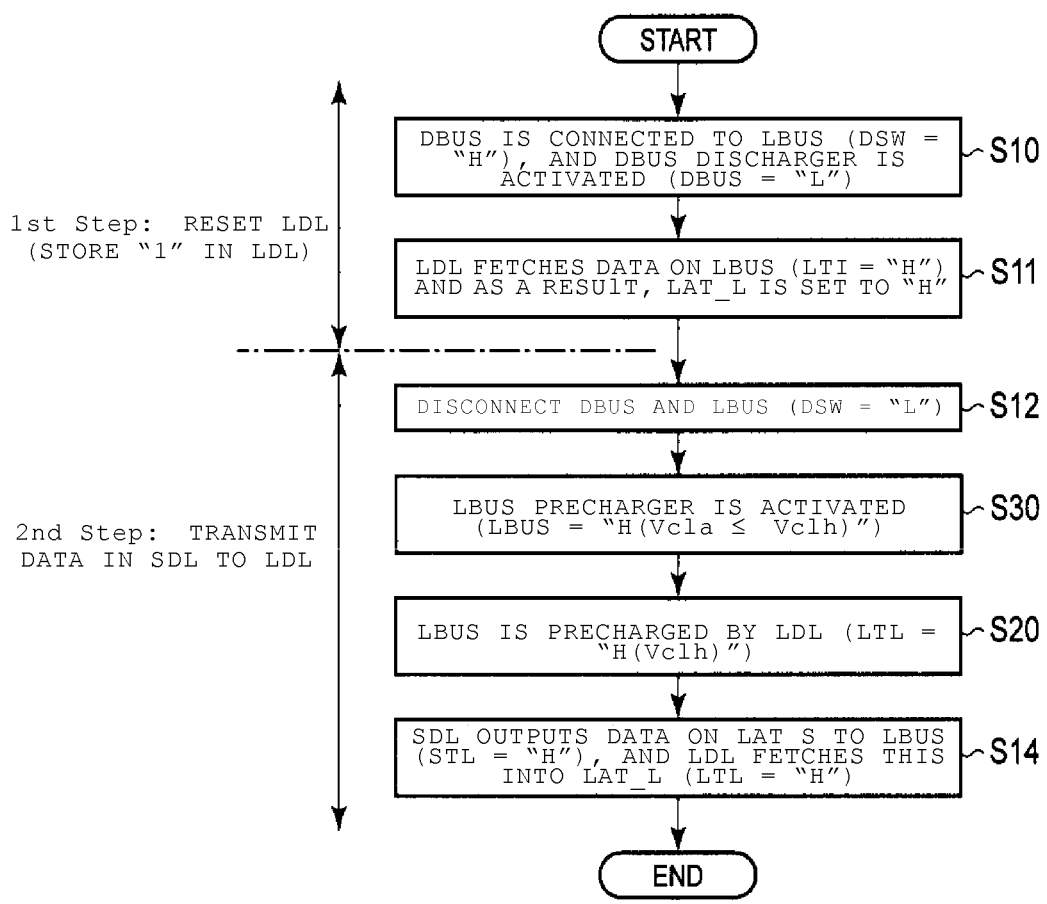
FIG. 17 is a flow chart of a method of transmitting data according to a third embodiment.
Figure 18:
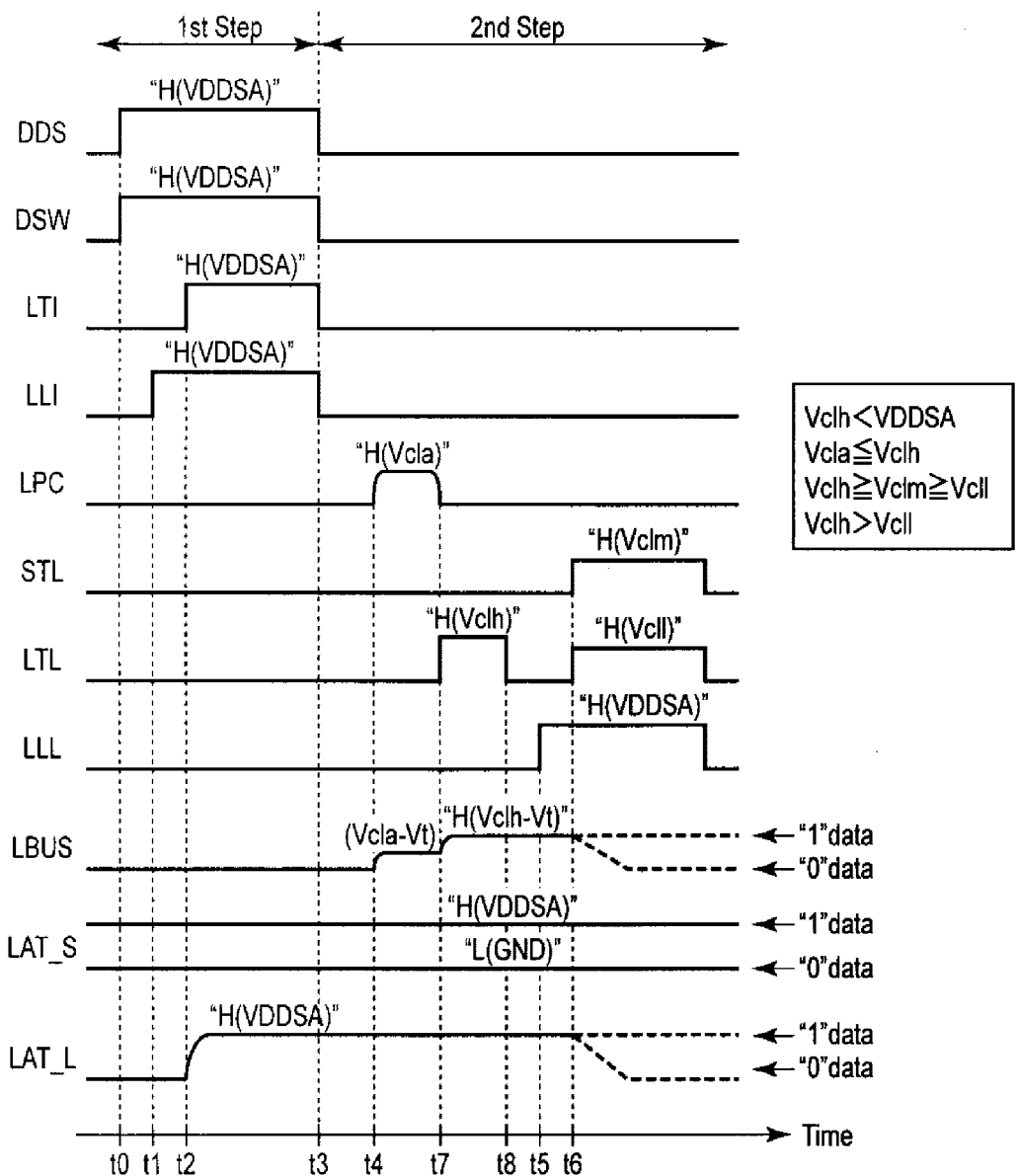
FIG. 18 is a timing chart of various signals at the time of data transmission according to the third embodiment.

3.1 Operation of Transmitting Data Between Latches Inside Sensor Amplifier Unit A case where data is transmitted from SDL to LDL in the same manner as in the first and second embodiments is described as an example of a data transmission operation according to the present embodiment, referring FIG. 17 and FIG. 18. FIG. 17 is a flowchart at the time of data transmission operation, and FIG. 18 is a timing chart for various signals at that time.

As illustrated, after Steps S10 to S12 described in the first embodiment, a control circuit 14 sets the signal LPC to an "H" level (Step S30 and at time t4). However, unlike in the first embodiment, an electric potential of the signal LPC is Vcla, and furthermore Vcla≤Vclh (preferably, Vcla<Vclh). As a result, an electric potential of the bus LBUS is increased up to (Vcla−Vt).

Next, the control circuit 14 sets the signal LPC to an "L" level and charges the bus LBUS by LDL (Step S20 and at time t7). As a result, as described in the second embodiment, the electric potential of the bus LBUS is charged to (Vclh−Vt).

An operation after a signal LTL is set to the "L" level at time t8 is the same as in the first embodiment.

3.2 Effect According to Present Embodiment

Figure 19:
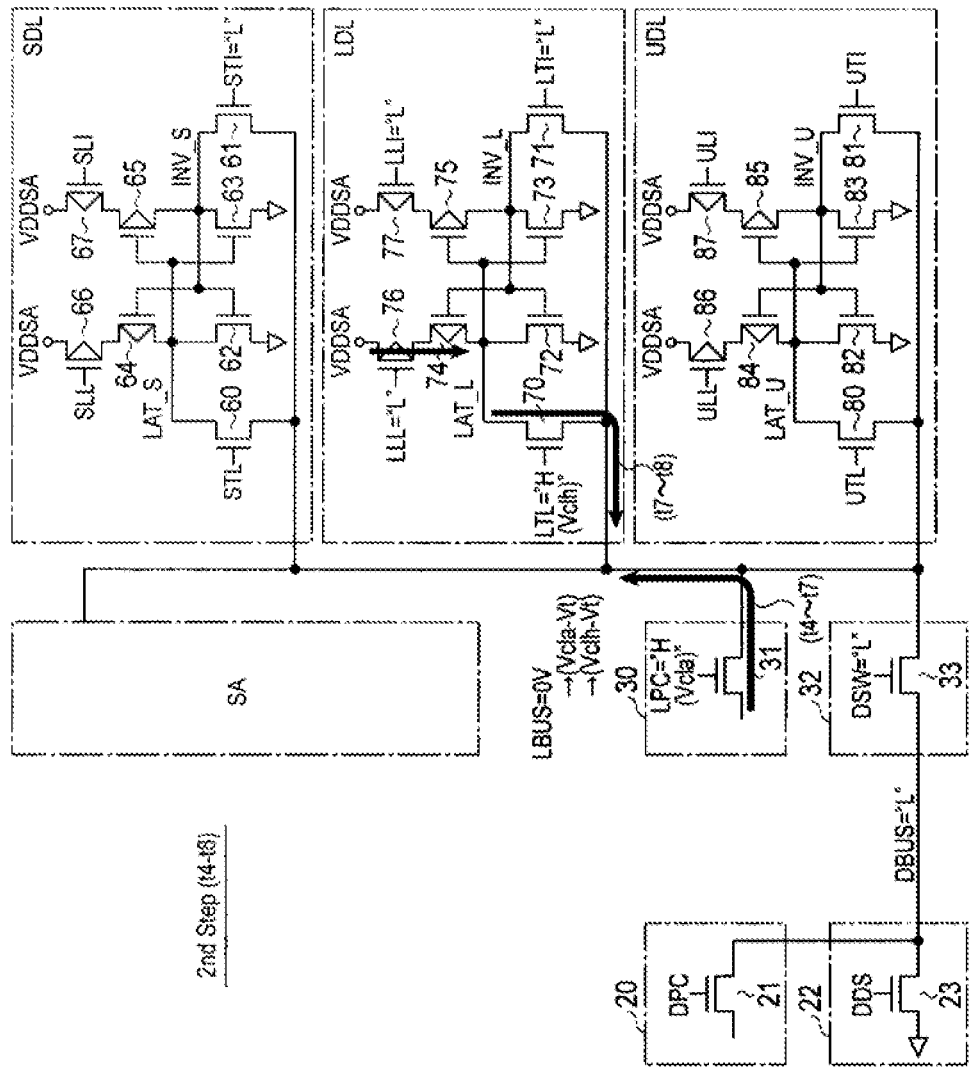
FIG. 19 is a circuit diagram of a sense amplifier unit according to the third embodiment.

In the method according to the present embodiment, reliability of operation of a NAND flash memory can be further improved. The present effect is described referring to FIG. 19. FIG. 19 is a circuit diagram of a sense amplifier unit SAU, and illustrates its operation when charging a bus LBUS.

According to the present embodiment, the charge of the bus LBUS is performed in two steps. That is, first, the charge circuit 30 increases the electric potential of the bus LBUS up to (Vcla−Vt). Thereafter, LDL increases the bus LBUS up to (Vclh−Vt) that is a final value. In the present method, stability of operation of a latch circuit can be improved.

For example, when LDL charges the bus LBUS, a ratio of an ON resistance of a series part of transistors 74 and 76 in FIG. 19 and an ON resistance of a transistor 70 is important. When the ON resistance of the transistor 70 is excessively low, when the transistor 70 is turned on, an electric potential of a node LAT_L between the transistor 74 and the transistor 70 is drastically decreased. As a result, there is concern that the electric potential of the node LAT_L will exceed a threshold of an inverter that is made from transistors 73 and 75 (the transistor 73 will transition from ON to OFF, and the transistor 75 will transition from OFF to ON), and retention data in a latch circuit LDL will be inverted.

In this respect, according to the second embodiment, when the transistor 70 is turned on, because the electric potential of the bus LBUS is 0 V, a voltage VGS between a gate and a source of the transistor 70 (the source is LBUS) is large and the ON resistance is comparatively small.

In contrast, according to the present embodiment, when the transistor 70 is turned on, the bus LBUS has been already charged to (Vcla−Vt). Therefore, VGS of the transistor 70 is lower and the On resistance is higher than in the second embodiment. Accordingly, stability of the latch circuit LDL can be improved, compared to the second embodiment. This is true for the other latch circuits SDL and UDL.

Furthermore, a charge level described referring to FIG. 16 can be reduced more than in the first embodiment.

4. Fourth Embodiment

Next, a semiconductor memory device according to a fourth embodiment is described. In the present embodiment, charging of a bus LBUS in the first to third embodiments is omitted. Only the parts of the present embodiment that differ from the first to third embodiments are described below.

Figure 20:
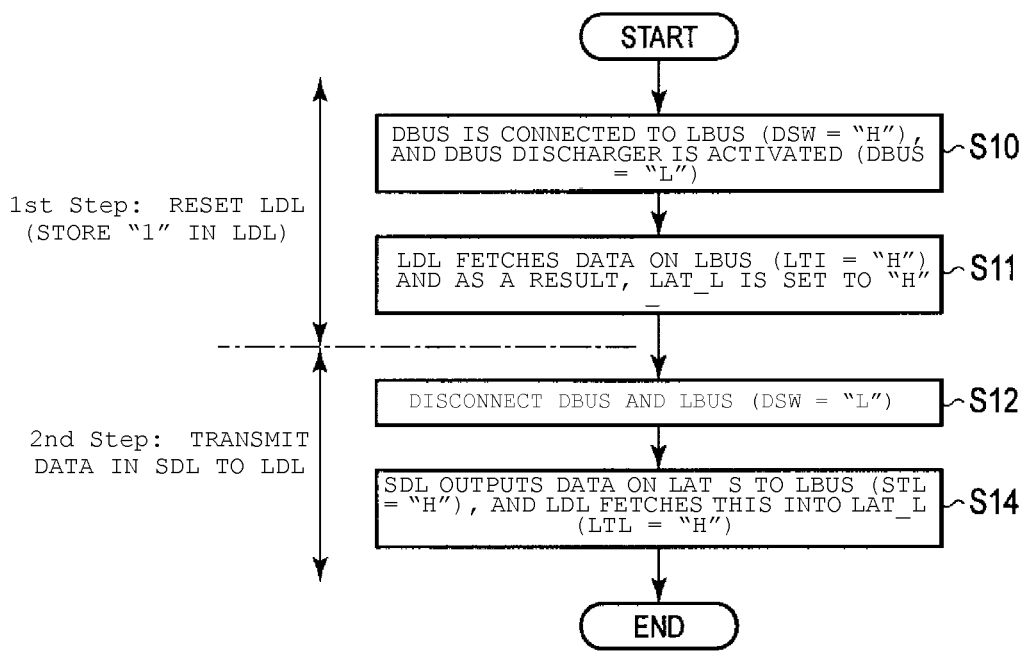
FIG. 20 is a flowchart of a method of transmitting data according to a fourth embodiment.
Figure 21:
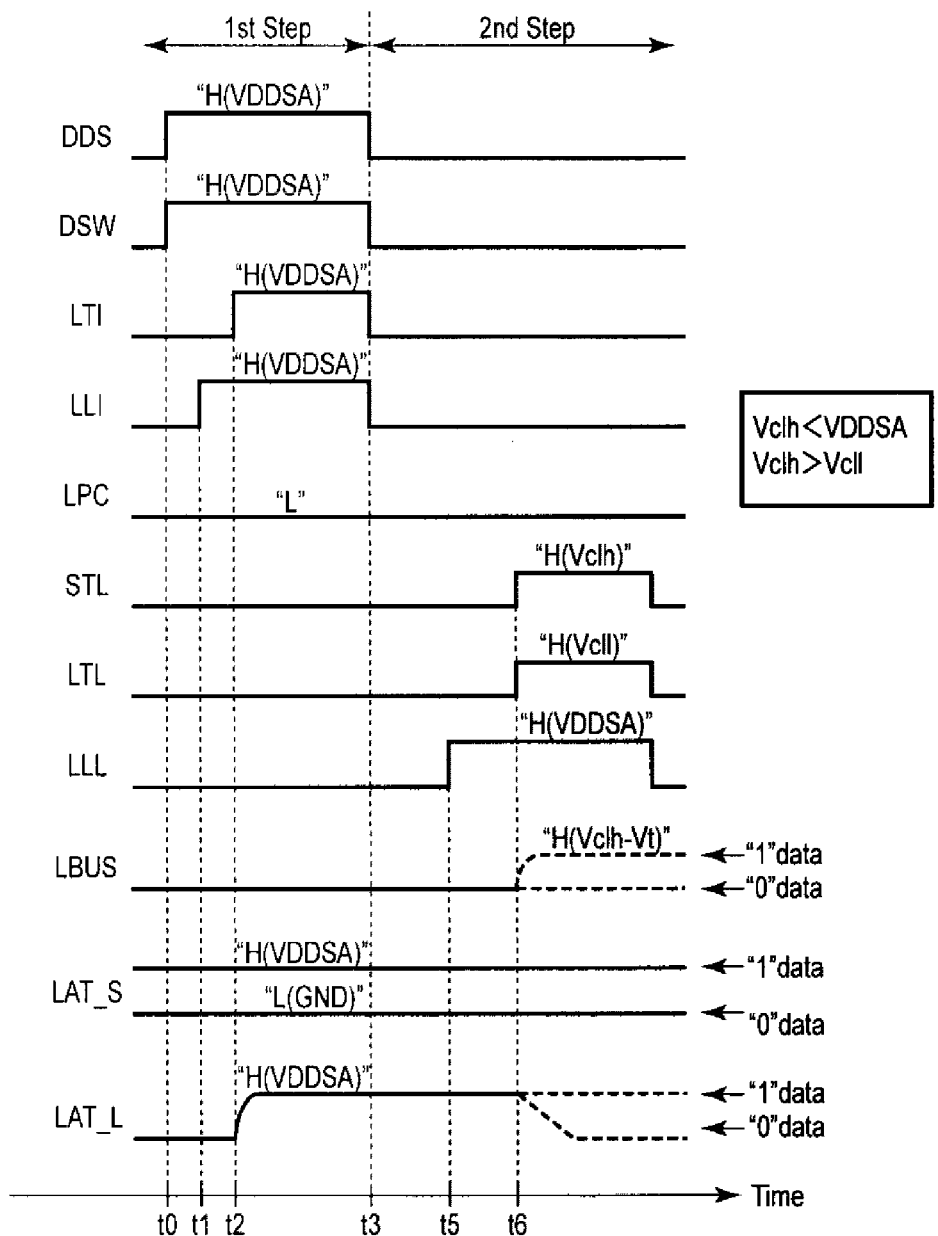
FIG. 21 is a timing chart of various signals at the time of data transmission according to the fourth embodiment.

4.1 Operation of Transmitting Data Between Latches Inside Sensor Amplifier Unit A case where data is transmitted from SDL to LDL in the same manner as in the first to third embodiments is described as an example of data transmission operation according to the present embodiment, referring to FIG. 20 and FIG. 21. FIG. 20 is a flowchart at the time of data transmission operation, and FIG. 21 is a timing chart for various signals at that time.

As illustrated in FIG. 20, a processing flow according to the present embodiment is equivalent to removing Step S13 in FIG. 7 described in the first embodiment. That is, as illustrated in FIG. 21, when the bus DBUS and the bus LBUS are disconnected, in a state where an electric potential of LBUS is 0 V, signals STL and LTL are set to an "H" level (at time t6). Then, the electric potential of the bus LBUS maintains 0 V depending on an electric potential of a node LAT_S, or is increased up to (Vclh−Vt).

The others are the same as in the first to third embodiments.

4.2 Effect According to Present Embodiment

If a capacity of the bus LBUS is small, as in the method according to the present embodiment, electric potentials of data transmission voltages STL and LTL are made smaller than a power source voltage VDDSA, and thus charge of LBUS can become unnecessary.

The reason for this is the same as the reason described above in the third embodiment. That is, according to the third embodiment, by turning on a transistor 70 after charging the bus LBUS, a transistor VGS is made smaller and thus data inversion in a latch circuit is prevented. In contrast, according to the present embodiment, a gate electric potential of the transistor 70 is lowered and thus VGS of the transistor is decreased. As a result, an On resistance of the transistor 70 can be increased, and stability of a latch circuit LDL can be improved. This is also true for the other latch circuits SDL and UDL.

5. Fifth Embodiment

Next, a semiconductor memory device according to a fifth embodiment is described. The present embodiment results from a charge circuit 30 assisting charge of a bus LBUS in the fourth embodiment described above. In other words, the present embodiment is equivalent to making an electric potential of a signal LPC smaller than Vclh in the first embodiment. Only the parts of the present embodiment that differ from the fourth embodiment are described below.

Figure 22:
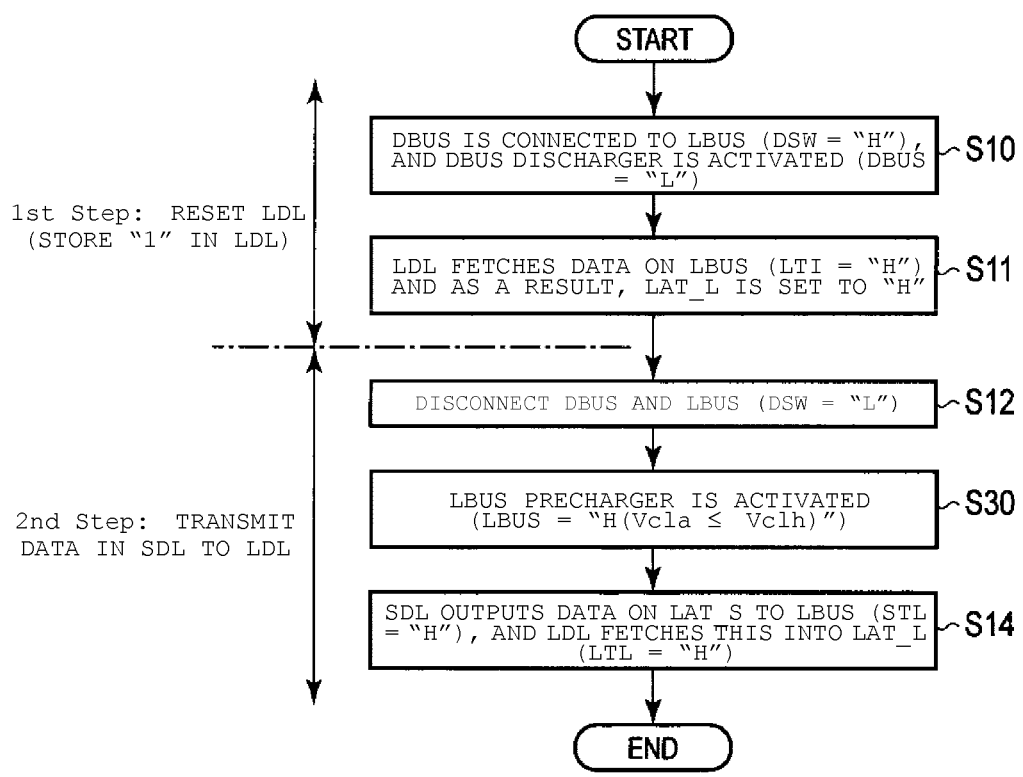
FIG. 22 is a flowchart of a method of transmitting data according to a fifth embodiment.
Figure 23:
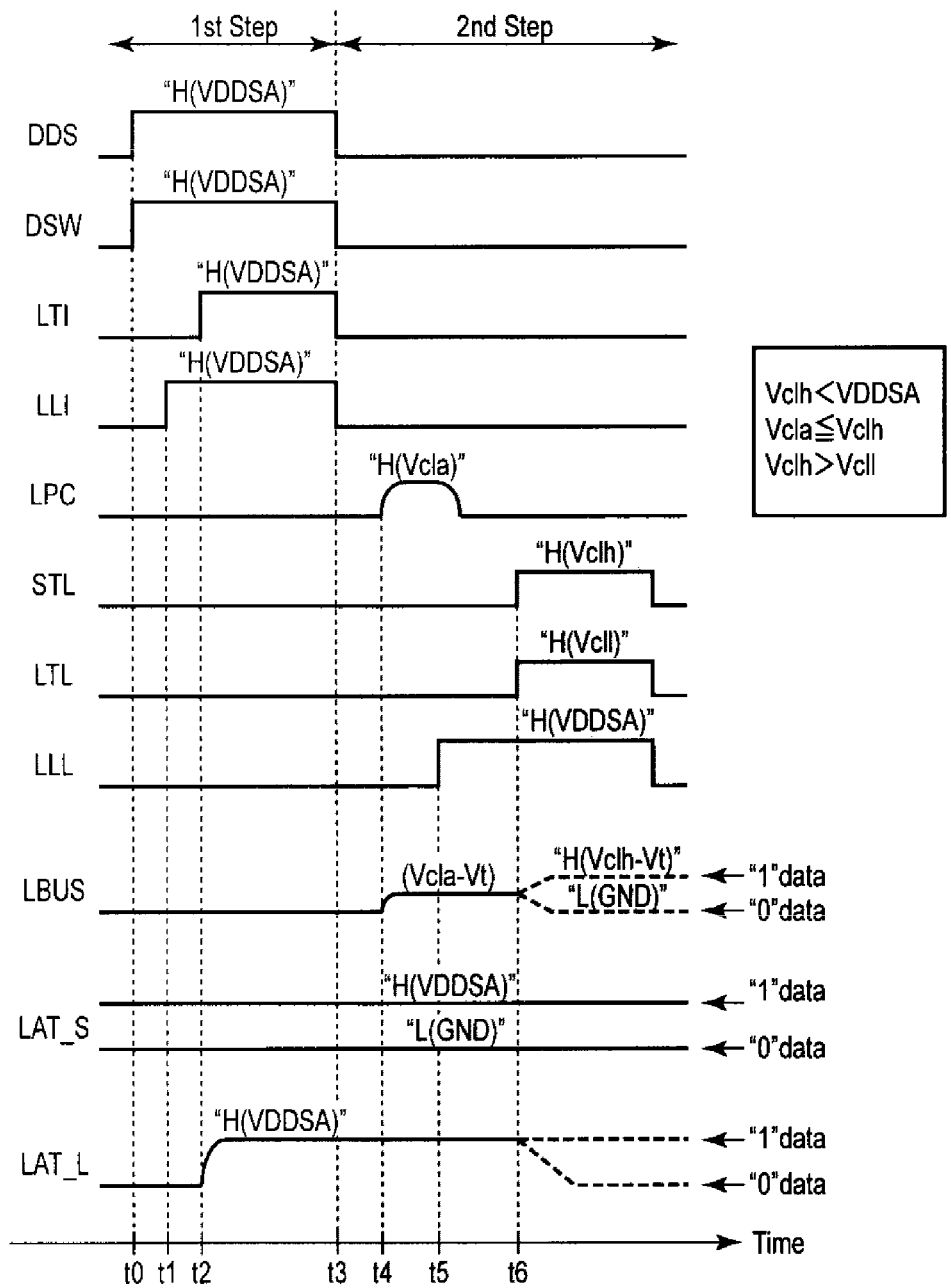
FIG. 23 is a timing chart of various signals at the time of data transmission according to the fifth embodiment.

5.1 Operation of Transmitting Data Between Latches Inside a Sense Amplifier Unit A case where data is transmitted from SDL to LDL in the same manner as in the first to third embodiments is described as an example of data transmission operation according to the present embodiment, referring to FIG. 22 and FIG. 23. FIG. 22 is a flowchart at the time of data transmission operation, and FIG. 23 is a timing chart for various signals at that time.

As illustrated in FIG. 22, a processing flow according to the present embodiment is equivalent to adding processing in Step S30, immediately before Step S14 in FIG. 20 described in the fourth embodiment. That is, as illustrated in FIG. 23, when the bus DBUS and the bus LBUS are disconnected, a control circuit 14 sets the signal LPC to an "H" level (Step S30 and a point in time t4). An electric potential of the signal LPC is Vcla as described in the third embodiment. As a result, an electric potential of the bus LBUS is increased up to (Vcla−Vt).

Thereafter, signals STL and LTL are set to the "H" level without further performing charge on the bus LBUS (a point in time t6). Then, the electric potential of the bus LBUS is decreased to 0 V, or is increased up to (Vclh−Vt), depending on an electric potential of a node LAT_S.

The others are the same as in the first to third embodiments.

5.2 Effect According to Present Embodiment

According to the present embodiment, while the charge of the bus LBUS becomes unnecessary, stability of operation of a latch circuit can be improved as described in the third embodiment.

6. Sixth Embodiment

Next, a semiconductor memory device according to a sixth embodiment is described. The present embodiment results from applying the first to fifth embodiments to data transmission between a latch circuit inside a sense amplifier unit SAU and a latch circuit XDL. Only the parts of the present embodiment that differ from the first to fifth embodiments are described below. Furthermore, a case where data is transmitted from the latch circuit XDL to the latch circuit LDL is described below as an example.

6.1 First Data Transmission Example

Figure 24:
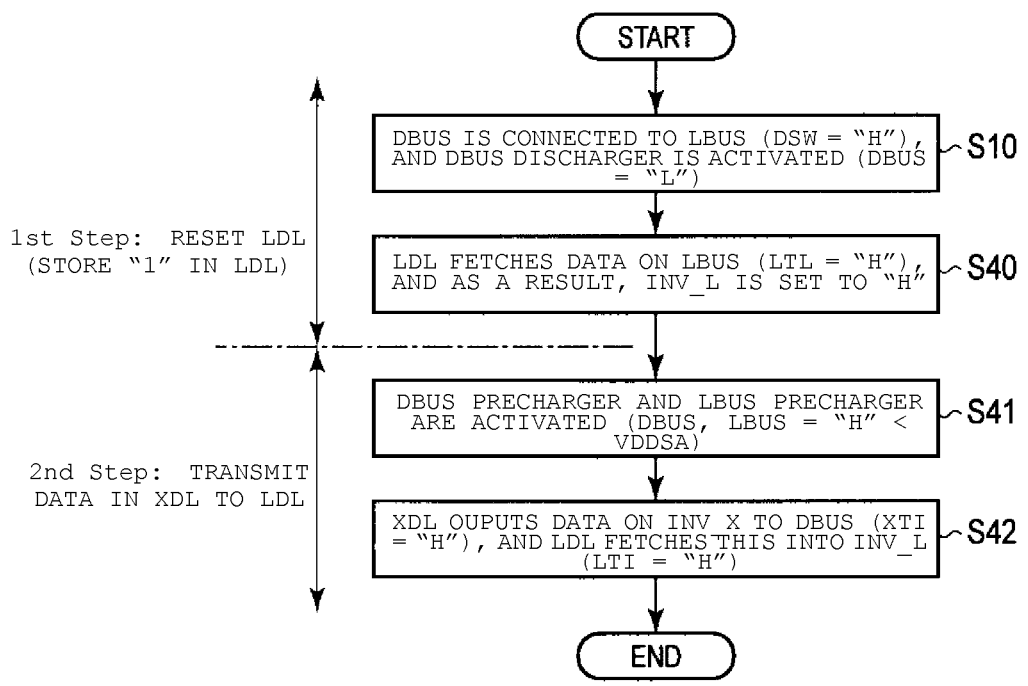
FIG. 24 is a flowchart of a method of transmitting data according to a first example of a sixth embodiment.
Figure 25:
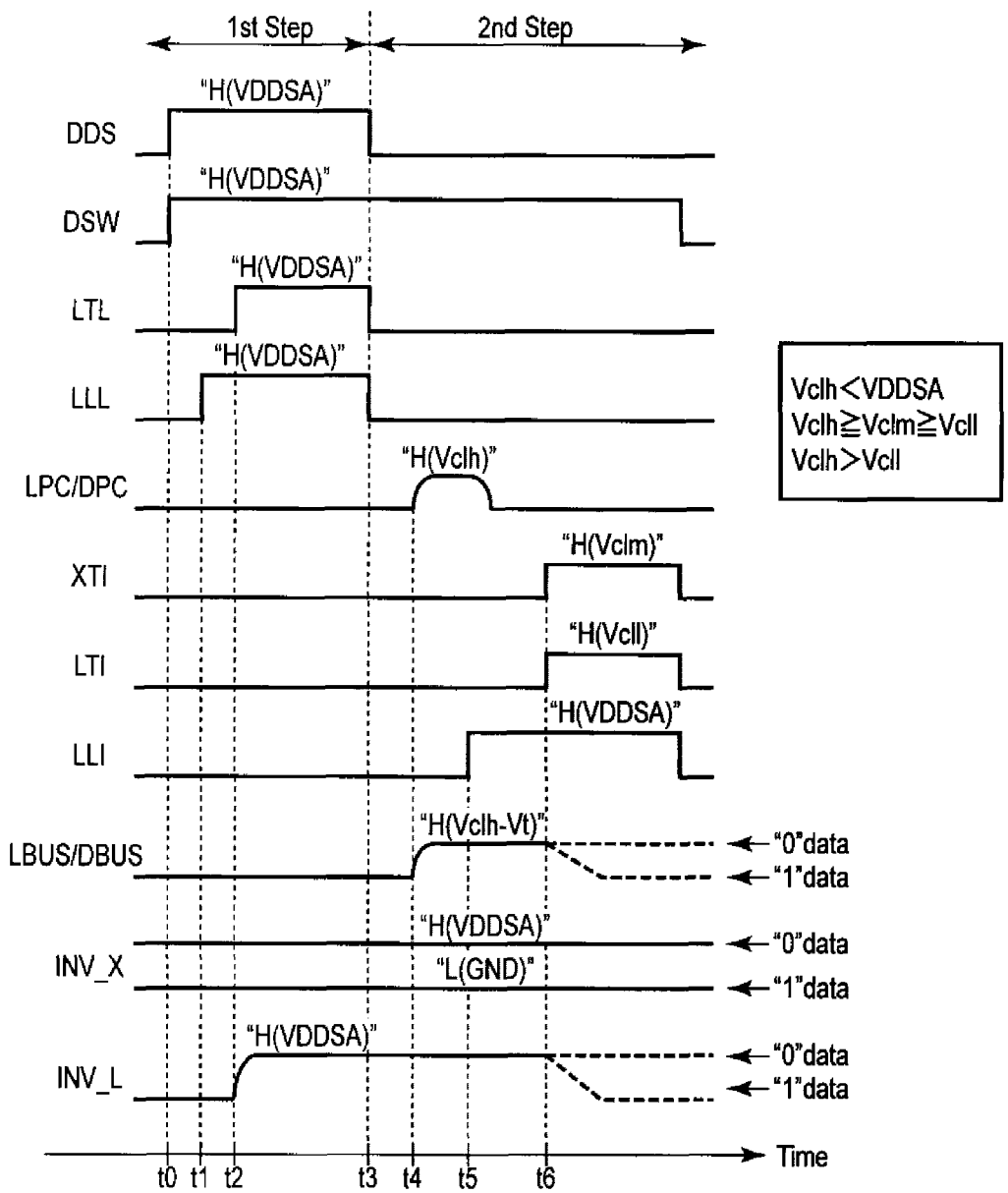
FIG. 25 is a timing chart of various signals at the time of transmitting data according to the first example of the sixth embodiment.

First, a first data transmission example is described referring to FIG. 24 and FIG. 25. The present example results from applying the method described in the first embodiment for the data transmission from XDL to LDL.

As illustrated in the first embodiment, a data transmission operation generally includes two steps. In a case of the data transmission from XDL to LDL, the first step is an operation of resetting LDL, and data "0" is stored in LDL. The second step that is performed is an operation of actually transmitting data from XDL to LDL.

As illustrated in FIG. 24, first, processing in Step S10 is performed, and, next, processing in Step S40 is performed. In Step S40, a control circuit 14 sets a signal LTL to an "H" level (at time t2). As a result, a node INV_L of the latch circuit LDL is set to the "H" level (VDDSA).

Next, processing in Step 41 is performed. That is, the control circuit 14 sets signals LPC and DPC to the "H" level (at time t4). Electric potentials of the signals LPC and DPC are Vclh, as described above. As a result, electric potentials of buses DBUS and LBUS are set to (Vclh−Vt). Moreover, like the transistor 31, the transistor 21, which charges DBUS, may be a type that clamps a voltage to (Vclh−Vt), or may be a transmission gate type.

Next, a latch circuit XDL outputs retention data on the buses DBUS and LBUS, and LDL fetches the retention data (Step S42). That is, the control circuit 14 sets a signal LLI to the "H" level (at time t5). Because of this, an electric potential of the node INV_L of LDL is set to a floating state at VDDSA. Thereafter, the control circuit 14 sets signals XTI and LTI to the "H" level (at time t6). Moreover, electric potentials of a signal XTL and the signal LTL are Vclm and Vcll, which are described above, respectively.

Inverted data (data in INV_X) retained by XDL is output to the buses DBUS and LBUS by setting a signal XTI to the "H" level. When XDL retains data "1" (INV_V="L"), a transistor 91 is in an ON state and electric potentials of the buses DBUS and LBUS transition to an "L" level (0 V). On the other hand, when XDL retains the data "0" (INV_X="H"), the transistor 91 is in a cut-off state, and the electric potentials of the buses DBUS and LBUS maintain the "H" level (Vclh−Vt).

Furthermore, a signal LTI is set to the "H" level (Vcll). Consequently, when the bus LBUS transitions to the "L" level (0 V), a transistor 70 is in the ON state, and the "L" level is stored in the node INV_L. On the other hand, when the bus LBUS maintains the "H" level (Vclh−Vt), the transistor 70 is in a cut-off state. Therefore, a node INV_L continues to retain the "H" level (VDDSA).

In this manner, in a case of the present example, because the node INV_X that retains inverted data of XDL is connected to the bus DBUS, when the data is transmitted from XDL to LDL, the signal LTI is set to the "H" level, contrary to the fact that, according to the first embodiment, the signal LTL is set to the "H" level. In other words, the inverted data retained by XDL is transmitted to the node INV_L that retains the inverted data retained by LDL.

Moreover, this is true for a case where the data is transmitted from a sense amplifier unit SAU to XDL. In XDL, as in SDL, LDL, and UDL, an n channel MOS transistor (a transistor 91) is used for a transmission gate in order to reduce an occupation area inside a chip. Therefore, when the "H" level is transmitted, an electric potential of transmission data is decreased by a threshold of the transistor 91. Thus, when the data is transmitted from the sense amplifier unit SAU to XDL, first, XDL is charged (reset), and thereafter INV_X is charged/discharged depending on data in DBUS.

More specifically, the data is first forcibly input from XBUS to XDL and INV_X is set to the "H" level. Thereafter, the transistor 91 is turned on or off depending on the electric potential of DBUS.

Furthermore, in the present example, Step S41 may be removed. The present example is equivalent to applying the method described in the fourth embodiment to the data transmission from XDL to LDL.

6.2 Second Data Transmission Example

Figure 26:
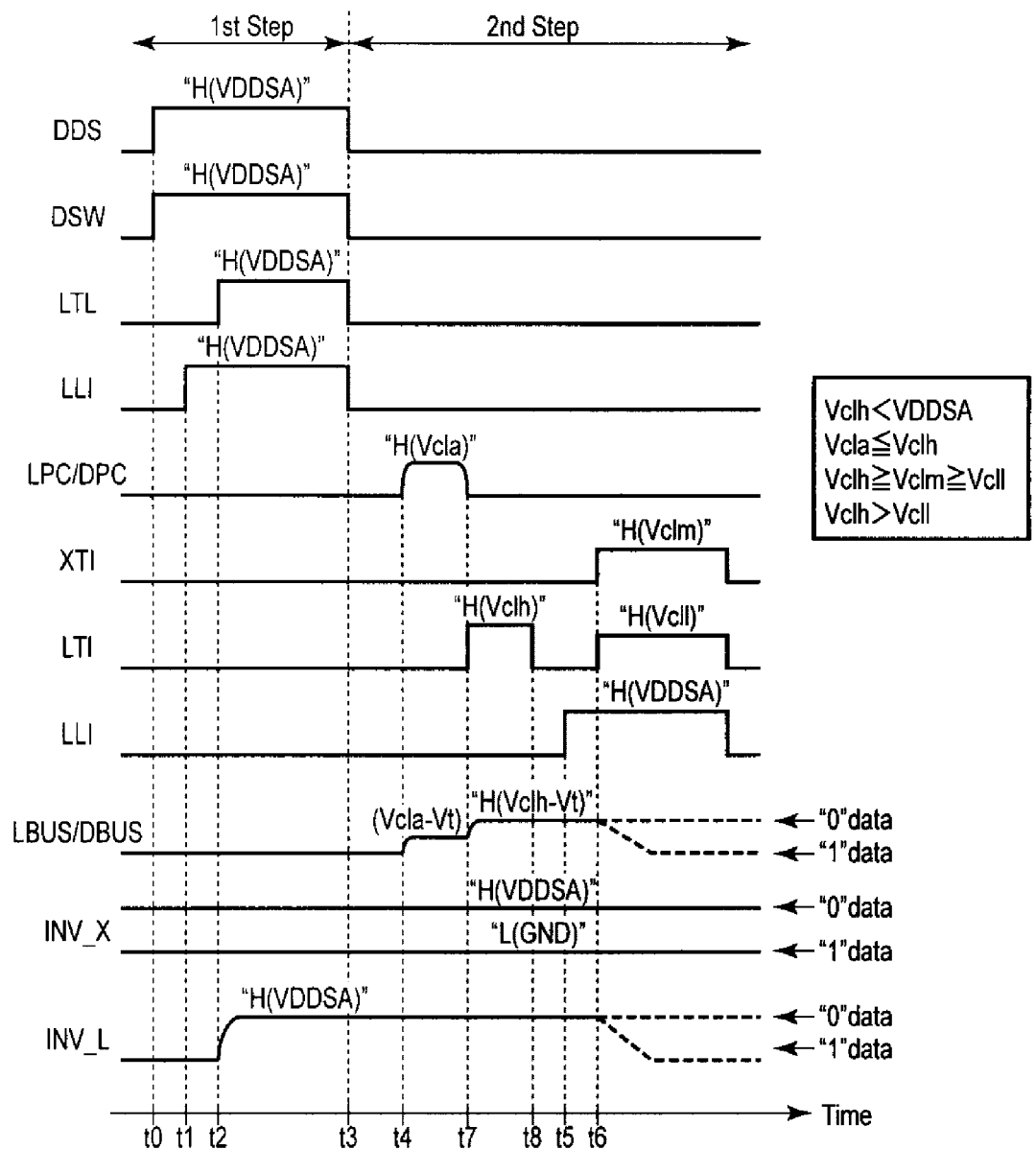
FIG. 26 is a timing chart of various signals at the time of transmitting data according to a second example of the sixth embodiment.

Next, a second data transmission example is described referring to FIG. 26. The present example results from applying the method described in the third embodiment for the data transmission from XDL to LDL. With regard to the detail of processing, because FIG. 17 is applied to FIG. 24, a flowchart is omitted.

As illustrated in FIG. 26, in the second step, signals LPC and DPC are set to an "H" level, as in Step S41 described in FIG. 24 (a point in time t4). This electric potential is Vcla as described in the third embodiment. As a result, electric potentials of buses DBUS and LBUS are increased from 0 V up to (Vcla−Vt).

Subsequently, the buses DBUS and LBUS are charged by LDL as described in Step S20 in the third embodiment. That is, a signal LTI is set to the "H" level (a point in time t7). An electric potential of the signal LTI is Vclh. As a result, the electric potentials of the buses DBUS and LBUS are increased from (Vcla−Vt) to (Vclh−Vt).

Thereafter, a signal XTI and the signal LTI are set to the "H" level as in the first data transmission example (a point in time t6). The electric potentials are Vclm and Vcll, respectively.

Furthermore, electric potentials of the signals LPC and DPC may be set to Vcla. The example corresponds to the fifth embodiment.

Furthermore, in the present example, the signals LPC and DPC may be maintained at an "L" level. The example is equivalent to applying the method described in the second embodiment for the data transmission from XDL to LDL.

6.3 Third Data Transmission Example

Next, a third data transmission example is described. In the first and second examples, the simple data transmission from XDL to LDL is described. However, the first to fifth embodiments can be used for a mathematical operation, data manipulation and the like among latches. Because the third data transmission example relates to such a case, a case where the third embodiment is applied to an operation of transmitting inverted data from XDL to LDL is described as one example. Of course, it is possible to apply the first, second, fourth, or fifth embodiment.

Figure 27:
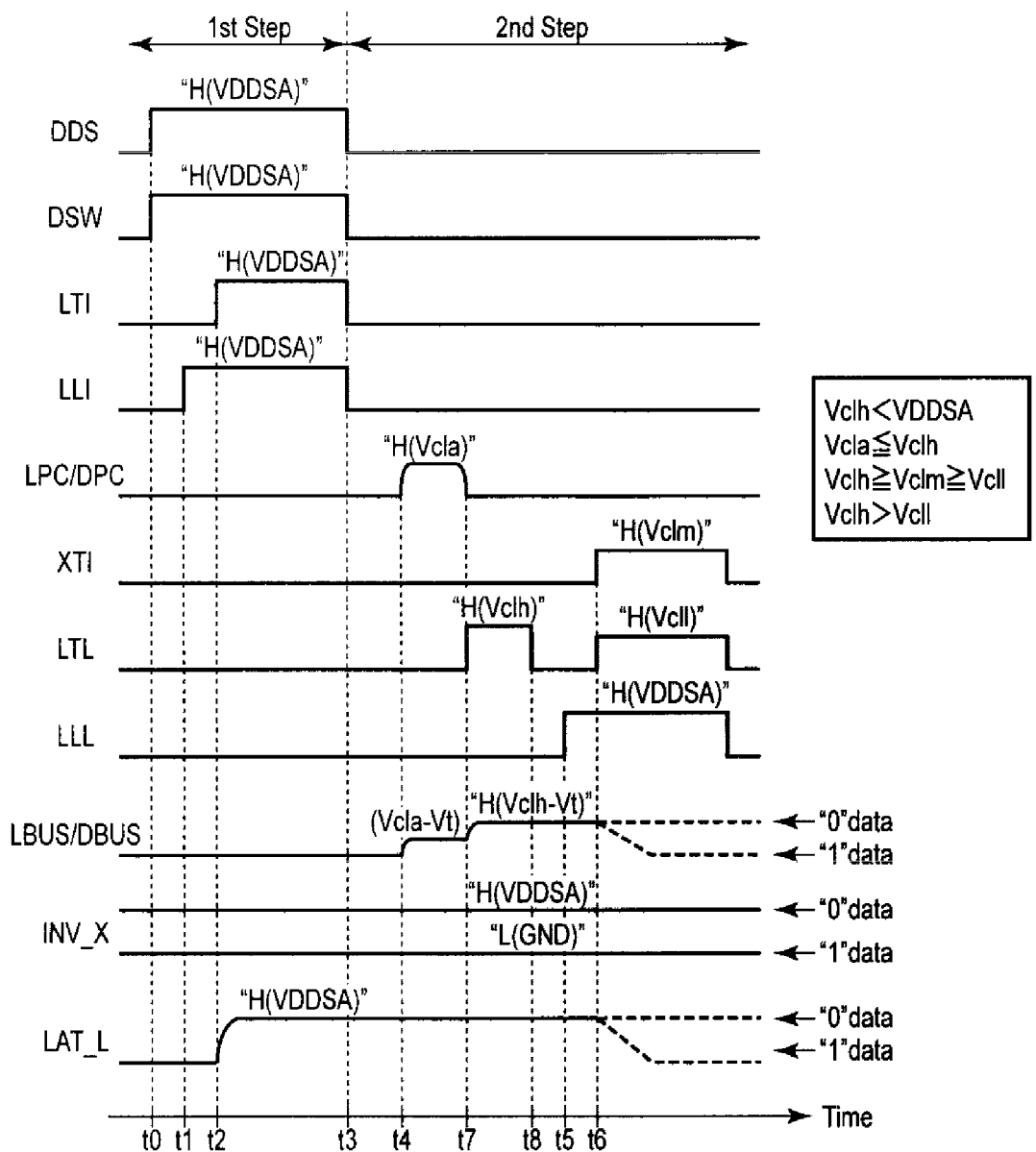
FIG. 27 is a timing chart of various signals at the time of transmitting data according to a third example of the sixth embodiment.

FIG. 27 is a timing chart for various signals according to the third data transmission example. As illustrated, in the first step, a signal LTI is set to an "H" level, and a node LAT_L of LDL is set to the "H" level (VDDSA).

Next, in the second step, signals LPC and DPC are set to Vcla, and subsequently a signal LTL is set to Vclh, and electric potentials of buses DBUS and LBUS are charged up to (Vclh−Vt).

Thereafter, a signal XTI and the signal LTL are set to an "H" level. The electric potentials are Vclm and Vcll, respectively. As a result, data (inverted data) in a node INV_X of XDL are transmitted to a node LAT_L of LDL.

6.4 Effect According to Present Embodiment

As described above, the method of transmitting data according to the first to fifth embodiments can be applied to various data transmission and data manipulation.

7. Seventh Embodiment

Next, a semiconductor memory device according to a seventh embodiment is described. The present embodiment relates to a configuration for generating a control signal of a sense amplifier unit SAU according to the first to sixth embodiments described above. Only the parts of the present embodiment that differ from the first to sixth embodiments are described below.

7.1 Configuration of Control Signal Generation Circuit

Figure 28:
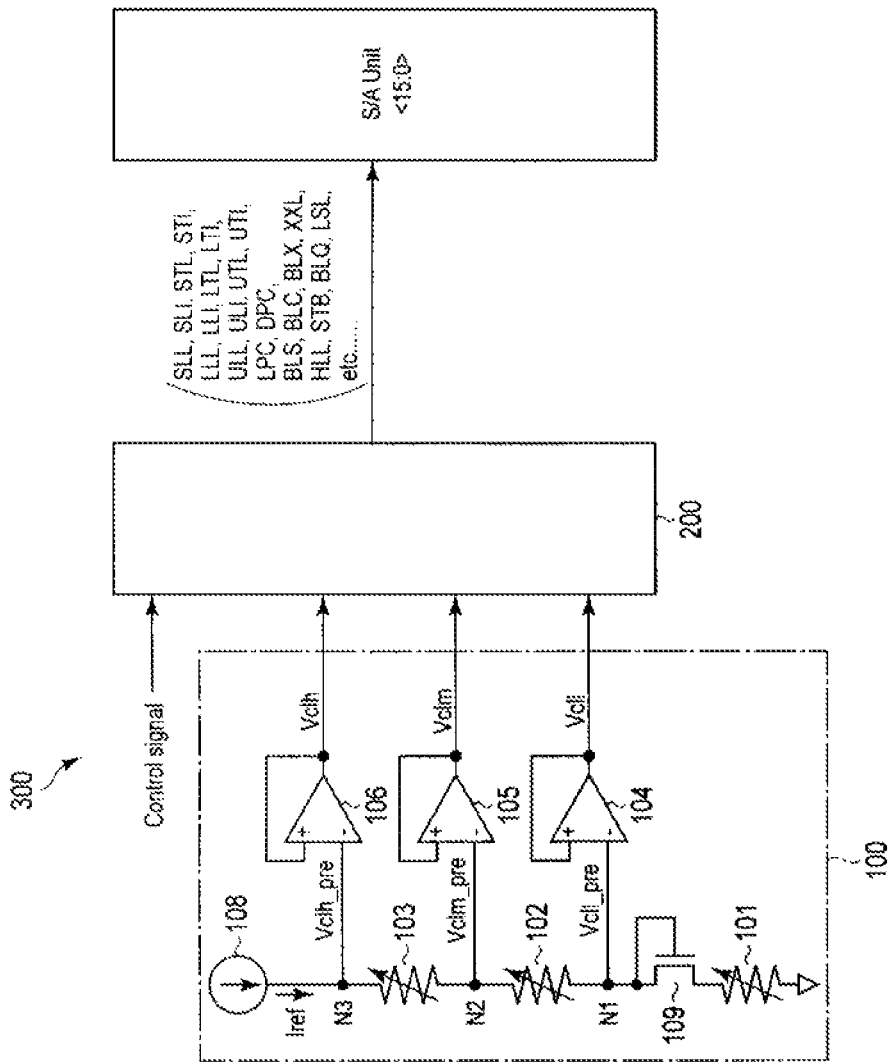
FIG. 28 is a circuit diagram of a voltage generation circuit according to a seventh embodiment.

FIG. 28 is a circuit diagram of a control signal generation circuit according to the present embodiment. FIG. 28 illustrates in detail the configuration to generate voltages Vclh, Vclm, and Vcll given specifically as a control signal LPC, DPC or the like.

As illustrated, a control signal generation circuit 300 includes a voltage generation circuit 100 and a sense amplifier control circuit 200.

The voltage generation circuit 100 includes variable resistance elements 101 to 103, comparators 104 to 106, an electric current source 108 and a low-resistance-to-voltage n channel MOS transistor 109.

The transistor 109 has the same size as a transistor inside a sense amplifier unit SAU. More specifically, the transistor 109 has the same threshold voltage as transmission transistors 60, 61, 70, 71, 80, and 81 of latch circuits SDL, LDL, and UDL, a transistor 31 or the like, or has the same gate width. Then, a gate and a drain of the transistor 109 are connected to a node N1 and the transistor 109 performs a function equivalent to a function of a diode.

One end of the resistance element 101 is connected to a source of the transistor 109, and the other end is grounded. The resistance element 102 is connected between the node N1 and a node N2, and the resistance element 103 is connected between the node N2 and a node N3. Resistance values of the resistance elements 101 to 103 are controlled, for example, by a control circuit 14 in such a manner to provide appropriate voltages Vclh, Vclm and Vcll, respectively. The electric current source 108 supplies a reference electric current Iref to the node N3.

The comparator 104 has an inverting input terminal connected to the node N1 and a non-inverting input terminal connected to an output terminal, and outputs the voltage Vcll equivalent to an electric potential Vcll_pre of the node N1. The comparator 105 has an inverting input terminal connected to the node N2 and a non-inverting input terminal connected to the output terminal, and outputs the voltage Vclm equivalent to an electric potential Vclm_pre of the node N2. The comparator 106 has an inverting input terminal connected to the node N3 and a non-inverting input terminal connected to the output terminal, and outputs the voltage Vclh equivalent to an electric potential Vclh_pre of the node N3.

The sense amplifier control circuit 200 receives the voltages Vclh, Vclm and Vcll from the voltage generation circuit 100, and furthermore receives a control signal from the control circuit 14. Then, various signals SLL, SLI, STL, STI, LLL, LLI, LTL, LTI, ULL, ULI, UTL, UTI, LPC, DPC, BLS, BLC, BLX, XXL, HLL, STB, BLQ, LSL and the like for controlling the sense amplifier unit SAU are generated based on the control signal from the control circuit 14.

Moreover, the control signal generation circuit 300 may be one part of the control circuit 14. In this case, a control unit inside the control circuit 14 supplies the control signal to the sense amplifier control circuit 200 and controls operation of the sense amplifier unit.

7.2 Effect According to Present Embodiment

According to the present embodiment, the voltages Vclh, Vclm, and Vcll used in the sense amplifier unit SAU are generated based on the transistor 109 that has the same size as the transistor inside the sense amplifier unit SAU. In other words, the voltages Vclh, Vclm, and Vcll can be generated while monitoring a variance in a threshold of the transistor in the sense amplifier unit SAU. Therefore, it is possible to reflect influences of temperature dependability and a variance in a threshold of the transistor, and the like in the voltages Vclh, Vclm, and Vcll.

8. Modification Examples and Others

As described above, the semiconductor memory device according to the first to seventh embodiments includes the memory cell array that includes the multiple memory cells that are stacked on the semiconductor substrate, and the sense amplifier that can retain the data read from or to be written to the memory cell. The sense amplifier includes the bus LBUS or DBUS that can transmit the data, the first latch circuit SDL that includes the first transistor Tr60, the second latch circuit LDL that includes the second transistor Tr70, and the third transistor 31 or 21 that charges the bus. The first latch circuit SDL includes the first data retention units Tr62 and Tr64, and the first transistor Tr60 that connects the first data retention unit and the bus. The second latch circuit LDL includes the second data retention units Tr72 and Tr74 and the second transistor Tr70 that connects to second data retention unit and the bus. The third transistor 31 or 21 charges the bus. At the time when the data is transmitted from the first latch circuit SDL to the second latch circuit LDL, the third transistor 30 charges the bus LBUS to the electric potential (Vclh−Vt) or (Vcla−Vt) lower than the power source voltage by applying the first voltage Vclh or Vcla lower than the power source voltage VDDSA of the first and second latch circuits to the gate (t4 to t6 in FIG. 8). Moreover, after charging the bus, the second and third voltages (STL=Vclm and LTL=Vcll) lower than the power source voltage are applied to the gates of the first and second transistors 60 and 70, respectively (t6 in FIG. 8).

Otherwise, when the third transistor is abandoned and the data is transmitted from the first latch circuit SDL to the second latch circuit LDL, the second latch circuit LDL charges the bus LBUS to the electric potential (Vclh−Vt) lower than the power source voltage VDDSA by applying the first voltage LTL=Vclh or Vcla lower than the power source voltage VDDSA of the first and second latch circuits to the gate of the second transistor Tr70 (t7 to t8 in FIG. 12). Moreover, after charging the bus, the second and third voltages STL=Vclm and LTL=Vcll lower than the power source voltage are applied to the gates of the first and second transistors 60 and 70, respectively (t6 in FIG. 8).

Otherwise, when the data is transmitted from the first latch circuit SDL to the second latch circuit LDL, the first and second voltage STL=Vclh and LTL=Vcll lower than the power source voltage are applied to the gates of the first and second transistors 60 and 70, respectively, without charging the bus (t6 in FIG. 21).

According to the present configuration, the reliability of the operation of the semiconductor memory device can be improved. Moreover, the embodiments are not limited to the ones described above, and various modifications are possible. For example, according to the first to fifth embodiments described above, the example is described in which the data is transmitted from SDL to LDL, but the same method can be applied to all the data transmission between SDL, LDL, and UDL. Furthermore, according to the sixth embodiment, the data transmission from XDL to LDL is described as the example, but the same method can be applied to all the data transmission between SDL, LDL and UDL and XDL.

Figure 29:
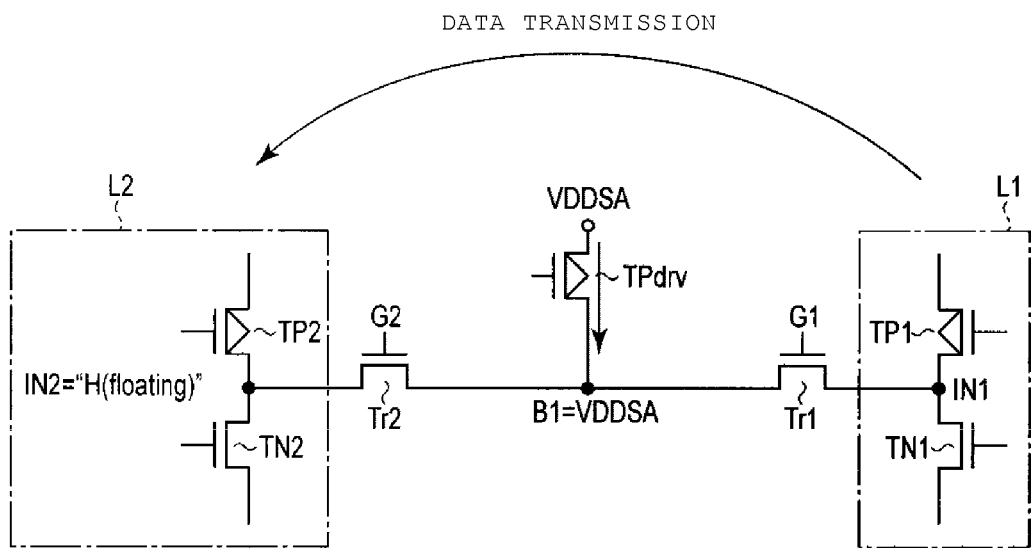
FIG. 29 is a circuit diagram illustrating data transmission between latches.

Furthermore, the embodiments described above are not limited to the transmission between the data latches in the NAND flash memory, and can be widely applied to the data transmission between the latch circuits, each having a transmission gate. FIG. 29 is a circuit diagram illustrating a configuration in which two latch circuits L1 and L2 are connected to each other with a data bus B1.

As illustrated, the latch circuit L1 is connected to the bus B1 with a n channel transmission transistor Tr1, and the latch circuit L2 is connected to the bus B1 with a n channel transmission transistor Tr2. Then, the bus B1 is driven by the power source voltage VDDSA that is the same as the power source voltage of the latch circuits L1 and L2. With this configuration, it is assumed that the data is transmitted from the latch circuit L1 to L2.

In this case, the latch L2, a transmission destination is set to an "H" level, and that input node IN2 is set to a state of floating at the "H" level. Then, the bus B1 is charged to VDDSA. Thereafter, data are transferred to L2 by the latch circuit L1. The data transmission is performed as follows. That is, (1) a case where the "H" level is transmitted: Because the bus B1 maintains the "H" level (VDDSA) and the transmission transistor Tr2 (also Tr1) is in an OFF state, the latch circuit L2 continues to retain the "H", and (2) a case where an "L" level is transmitted: Because the bus B1 is decreased to an "L" level (0 V), and the transmission transistor Tr2 is in the ON state, retention data in the latch circuit L1 transitions from the "H" level to the "L" level (IN2="L").

Figure 30:
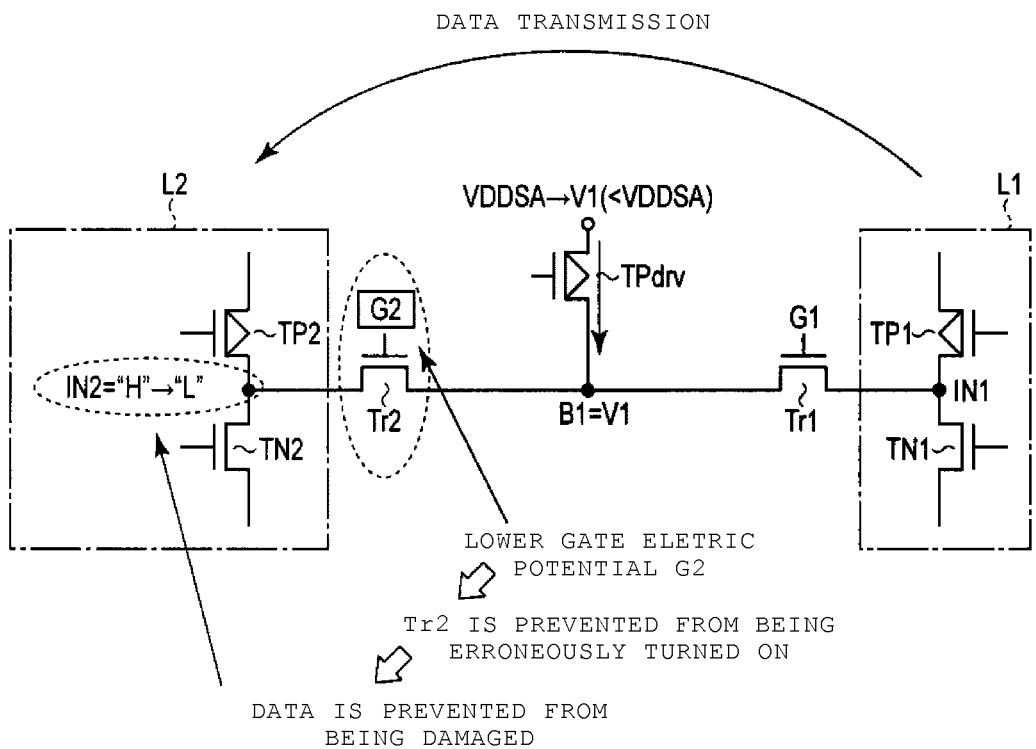
FIG. 30 is a circuit diagram further illustrating data transmission between the latches.

The embodiments described above can be widely applied with respect to the data transmission between such latch circuits. That is, as illustrated in FIG. 30, a bus drive voltage is decreased from VDDS to V1 (equivalent to (Vclh−Vt) described in the embodiment). Because of this, the power consumption can be reduced. Moreover, the power source voltage of the latch circuits L1 and L2 still remains VDDSA.

However, if, only when the bus drive voltage is lowered, the latch circuit L1 transmits the "H" level, there is concern that the transmission transistor Tr2 that has to be in an OFF state depending on the bus drive voltage and a gate electric potential G2 of the transmission transistor Tr2 will be in the ON state. As a result, the retention data in the latch circuit L2 changes from the "H" level to the "L" level. That is, the retention data in the latch circuit L2 is damaged. This problem is the same as in the latch circuit L1.

In order to prevent this, as described in the embodiment described above, the gate electric potential of the transmission transistor Tr2 is also set to be lower than the power source voltage VDDSA of the latch circuit L2 (equivalent to LTL=Vcll in FIG. 8). This is also true for a transmission source, the latch circuit L1. That is, the gate electric potential of the transmission transistor Tr1 is also set to be lower than the power source voltage VDDSA of the latch circuit L1 (equivalent to STL=Vclm in FIG. 8).

Because of this, while maintaining stability of operation of the latch circuit, the power consumption can be reduced.

Furthermore, according to the embodiment described above, the three-dimensional stacked layer type NAND flash memory is described as an example of the semiconductor memory device. The three-dimensional stacked construction is not limited specifically to a predetermined construction, and a construction equivalent to the construction of the circuit illustrated in FIG. 2 may be possible. For example, a construction in which transistors MT0 to MT7 are stacked on top of one another in the direction vertical to the semiconductor substrate may be possible, or a construction in which a series connection between the transistors MT0 to MT8 is arranged in a U-shaped pattern above the semiconductor substrate may be possible. Furthermore, the embodiment described above is not limited to the three-dimensional stacked type, and may be applied to a NAND flash memory and the like in the related art, in which the memory cells are arranged in two dimensions inside a plane of the semiconductor substrate.

Figure 31:
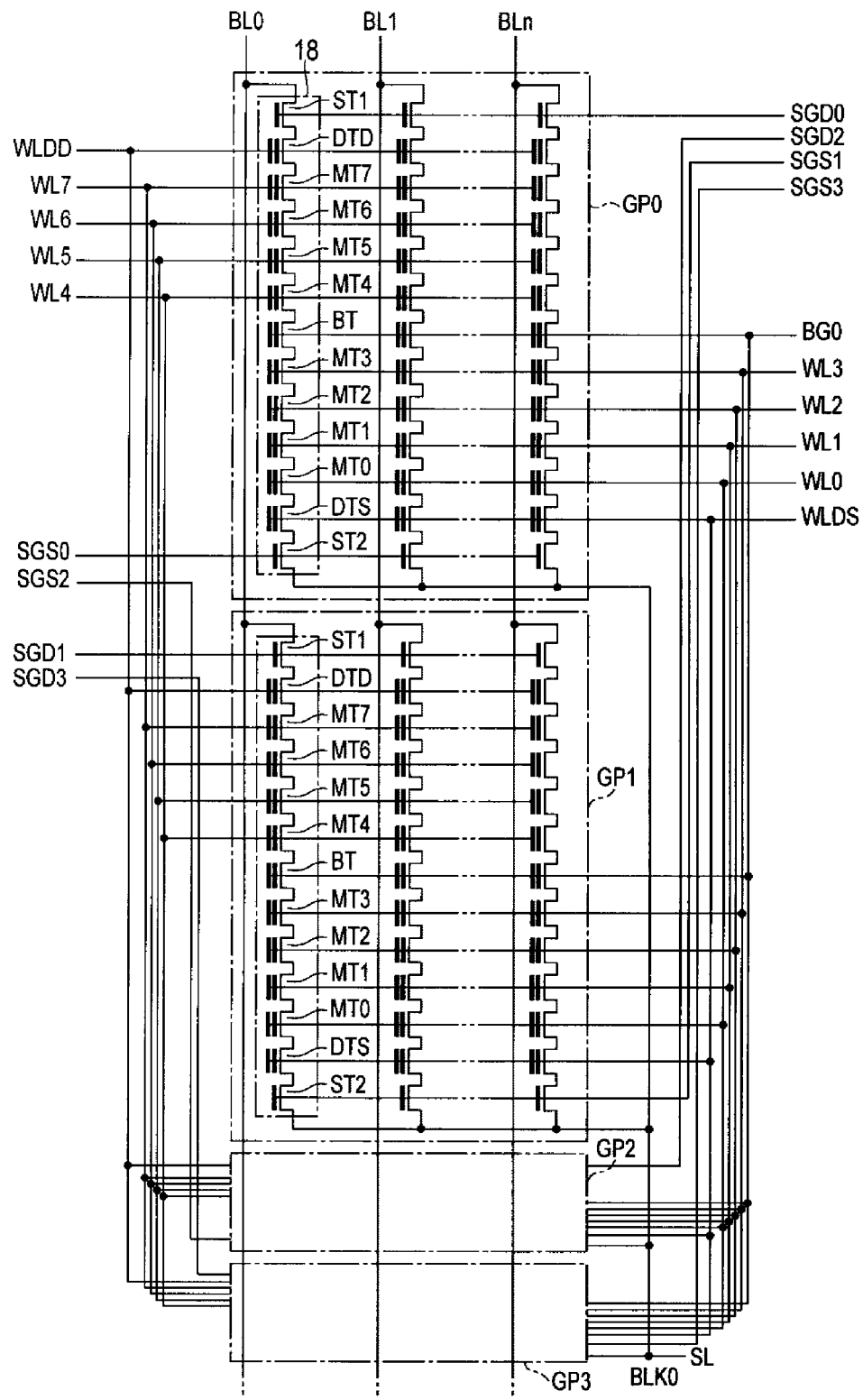
FIG. 31 is a circuit diagram of a memory cell array according to modification examples of the first to the seventh embodiments.

Furthermore, the memory cell array illustrated in FIG. 2 may have the configuration in FIG. 31. FIG. 31 is a circuit diagram of a block BLK0, and the other blocks BLK can also have the same configuration as the block BLK0. As illustrated, word lines WL0 to WL3, a dummy word line WLDD adjacent to the word line WL0, a back gate line BG, even-numbered select gate lines SGD0 and SGD2, and odd-numbered select gate lines SGS1 and SGS3 are drawn out to one end of a memory cell array 10. In contrast, word lines WL4 to WL7, a dummy word line WLDS adjacent to the word line WL7, even-numbered select gate lines SGS0 and SGS2, and odd-numbered select gate lines SGD1 and SGD3 are drawn out to the other end of the memory cell array, which is opposite to the one end. This configuration may be possible. According to the present embodiment, for example, a row decoder that selects the word line WL may be divided into two row decoders and the two row decoders may be arranged in such a manner that the two row decoders face toward each other with the memory cell array 10 being interposed between them. Then, the select gate lines SGD0, SGD2, SGS1, and SGS3, the word lines WL0 to WL3, the dummy word line WLDD and the back gate line BG may be selected by one row decoder and the select gate lines SGS0, SGS2, SGD1, and SGD3, the word lines WL4 to WL7 and the dummy word line WLDS may be selected by the other row decoder. With the present configuration, wiring congestion of the select gate line, word line or the like in a region between a low-series peripheral circuit (the row decoder or a row driver) and the memory cell array 10 can be alleviated.

Furthermore, the electric potential of the signal in the embodiment described above is strictly one example and the electric potential, if its function can be performed, is not limited to the value described above. Furthermore, in the flow chart described in the embodiment, processing order may be changed whenever possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array that includes multiple memory cells that are stacked above a semiconductor substrate; and
a sense amplifier that can retain data read from or to be written to a memory cell, the sense amplifier including a bus that can transmit the data, a first latch circuit that includes a first data retention unit and a first transistor connecting the first data retention unit and the bus, a second latch circuit that includes a second data retention unit and a second transistor connecting the second data retention unit and the bus, and a third transistor, wherein
when the data is transmitted from the first latch circuit to the second latch circuit, the third transistor is switched on to charge the bus to an electric potential lower than a power source voltage of the first and second latch circuits, by applying a first voltage lower than the power source voltage to a gate of the third transistor, and
after precharging the bus, second and third voltages that are lower than the power source voltage, are applied to gates of the first and second transistors, respectively.

2. The semiconductor memory device according to claim 1, wherein the second latch circuit precharges the bus by applying a fourth voltage that is lower than the first voltage to a gate of the second transistor, and
thereafter, the third transistor is switched on to precharge the bus.

3. The semiconductor memory device according to claim 2, wherein a value of the first voltage is greater than or equal to a value of the second voltage and greater than the value of the third voltage, and the value of the second voltage is greater than or equal to the value of the third voltage.

4. The semiconductor memory device according to claim 1, wherein a value of the first voltage is less than or equal to a value of the second voltage, and the value of the second voltage is greater than a value of the third voltage.

5. The semiconductor memory device according to claim 1, wherein the first and second transistors are each an n channel MOS transistor.

6. The semiconductor memory device according to claim 5, wherein when the data is transmitted from the first latch circuit to the second latch circuit, before precharging the bus, the second data retention unit of the second latch circuit is first reset and then set to a floating state.

7. The semiconductor memory device according to claim 1, wherein
when the data is transmitted from the first latch circuit to the second latch circuit, the bus is set to a high logic level, and the second data retention unit is set to a floating state with the high logic level,
when the first latch circuit retains a high logic level, the first and second transistors are set to an OFF state, and
when the first latch circuit retains a low logic level, the first and second transistors are set to an ON state, and the bus is discharged.

8. The semiconductor memory device according to claim 1, wherein
at the time of data reading, the sense amplifier causes the data that is read from the memory cell to be retained in at least one of the first and second latch circuits, and
at the time of data writing, the sense amplifier writes the data retained in at least one of the first and second latch circuits to the memory cell.

9. A semiconductor memory device comprising:
a memory cell array that includes multiple memory cells that are stacked above a semiconductor substrate; and
a sense amplifier that can retain data read from or to be written to a memory cell, the sense amplifier including a bus that can transmit the data, a first latch circuit that includes a first data retention unit and a first transistor connecting the first data retention unit and the bus, and a second latch circuit that includes a second data retention unit and a second transistor connecting the second data retention unit and the bus, wherein
when the data is transmitted from the first latch circuit to the second latch circuit, the second latch circuit precharges the bus to an electric potential lower than a power source voltage of the first and second latch circuits by applying a first voltage lower than the power source voltage to a gate of the second transistor, and
after precharging the bus, second and third voltages that are lower than the power source voltage, are applied to gates of the first and second transistors, respectively.

10. The semiconductor memory device according to claim 9,
wherein a value of the first voltage is greater than or equal to a value of the second voltage and greater than a value of the third voltage, and the value of the second voltage is greater than or equal to the value of the third voltage.

11. The semiconductor memory device according to claim 9, wherein the first and second transistors are each an n channel MOS transistor.

12. The semiconductor memory device according to claim 11, wherein when the data is transmitted from the first latch circuit to the second latch circuit, before precharging the bus, the second data retention unit of the second latch circuit is first reset and then set to a floating state.

13. The semiconductor memory device according to claim 9, wherein
when the data is transmitted from the first latch circuit to the second latch circuit, the bus is set to a high logic level, and the second data retention unit is set to a floating state with the high logic level,
when the first latch circuit retains a high logic level, the first and second transistors are set to an OFF state, and
when the first latch circuit retains a low logic level, the first and second transistors are set to an ON state, and the bus is discharged.

14. The semiconductor memory device according to claim 9, wherein
at the time of data reading, the sense amplifier causes the data that is read from the memory cell to be retained in at least one of the first and second latch circuits, and
at the time of data writing, the sense amplifier writes the data retained in at least one of the first and second latch circuits to the memory cell.

15. A semiconductor memory device comprising:
a memory cell array that includes multiple memory cells that are stacked above a semiconductor substrate; and
a sense amplifier that can retain data read from or to be written to a memory cell, the sense amplifier including a bus that can transmit the data, a first latch circuit that includes a first data retention unit and a first transistor connecting the first data retention unit and the bus, and a second latch circuit that includes a second data retention unit and a second transistor connecting the second data retention unit and the bus, wherein
when the data is transmitted from the first latch circuit to the second latch circuit, first and second voltages that are lower than a power source voltage of the first and second latch circuits are applied to gates of the first and second transistors, respectively, when the bus is at ground voltage.

16. The semiconductor memory device according to claim 15,
wherein the first and second transistors are each an n channel MOS transistor.

17. The semiconductor memory device according to claim 15, wherein
when the data is transmitted from the first latch circuit to the second latch circuit, the bus is set to a high logic level, and the second data retention unit is set to a floating state with the high logic level,
when the first latch circuit retains a high logic level, the first and second transistors are set to an OFF state, and
when the first latch circuit retains a low logic level, the first and second transistors are set to an ON state, and the bus is discharged.

18. The semiconductor memory device according to claim 17, wherein the high logic level to which the bus is set is lower than the high logic level retained by the first latch circuit.

19. The semiconductor memory device according to claim 15, wherein
at the time of the data reading, the sense amplifier causes the data that is read from the memory cell to be retained in at least one of the first and second latch circuits, and
at the time of the data writing, the sense amplifier writes the data retained in at least one of the first and second latch circuits to the memory cell.

20. The semiconductor memory device according to claim 15,
wherein the first voltage is greater than the second voltage.

* * * * *